(12) United States Patent
Lichtenwalner et al.

(10) Patent No.: US 9,887,287 B1
(45) Date of Patent: Feb. 6, 2018

(54) POWER SEMICONDUCTOR DEVICES HAVING GATE TRENCHES WITH IMPLANTED SIDEWALLS AND RELATED METHODS

(71) Applicant: Cree, Inc., Durham, NC (US)

(72) Inventors: Daniel J. Lichtenwalner, Raleigh, NC (US); Edward R. Van Brunt, Raleigh, NC (US); Brett Hull, Raleigh, NC (US); Alexander V. Suvorov, Durham, NC (US); Craig Capell, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/372,516

(22) Filed: Dec. 8, 2016

(51) Int. Cl.
*H01L 29/423* (2006.01)
*H01L 29/74* (2006.01)
(Continued)

(52) U.S. Cl.
CPC ........ *H01L 29/7813* (2013.01); *H01L 27/088* (2013.01); *H01L 29/0623* (2013.01); *H01L 29/4236* (2013.01); *H01L 29/66734* (2013.01); *H01L 29/7811* (2013.01)

(58) Field of Classification Search
CPC ......... H01L 29/47141; H01L 29/66143; H01L 29/66348; H01L 29/66712; H01L 29/66734; H01L 29/7395; H01L 29/7802; H01L 29/7813; H01L 29/7827; H01L 21/8224; H01L 21/823431; H01L 21/823487; H01L 21/823821; H01L 21/823885; H01L 27/082; H01L 27/0821; H01L 27/0823; H01L 27/0825;
(Continued)

(56) References Cited

U.S. PATENT DOCUMENTS 7,989,882 B2    8/2011    Zhang et al.
8,232,558 B2    7/2012    Zhang et al.
(Continued)

OTHER PUBLICATIONS

Yasuhiro Kagawa, Rina Tanaka, N. Fujiwara, K. Sugawara, Y. Fukui, N. Miura, M. Imaizumi, S. Nakata, and S. Yamakawa, Interoduction of depletion stopper for reduction of JFET resistance for 4H-SiC Trench MOSFET, Materials Science Forum, vols. 821-823 (2015), pp. 761-764.
(Continued)

*Primary Examiner* — Hsien Ming Lee
(74) *Attorney, Agent, or Firm* — Myers Bigel, P.A.

(57) ABSTRACT

Semiconductor devices include a semiconductor layer structure having a wide band-gap semiconductor drift region having a first conductivity type. A gate trench is provided in an upper portion of the semiconductor layer structure, the gate trench having first and second opposed sidewalls that extend in a first direction in the upper portion of the semiconductor layer structure. These devices further include a deep shielding pattern having a second conductivity type that is opposite the first conductivity type in the semiconductor layer structure underneath a bottom surface of the gate trench, and a deep shielding connection pattern that has the second conductivity type in the first sidewall of the gate trench. The devices include a semiconductor channel region that has the first conductivity type in the second sidewall of the gate trench.

22 Claims, 17 Drawing Sheets

(51) Int. Cl.
  *H01L 29/80* (2006.01)
  *H01L 21/337* (2006.01)
  *H01L 21/336* (2006.01)
  *H01L 29/78* (2006.01)
  *H01L 29/06* (2006.01)
  *H01L 27/088* (2006.01)
  *H01L 29/66* (2006.01)

(58) Field of Classification Search
  CPC ............. H01L 27/0826; H01L 27/0886; H01L 27/0924; H01L 27/10841
  USPC ....... 438/170, 172, 189, 197, 202, 204, 205, 438/268–272; 257/105, 127, 134, 197, 257/198, 263, 302, 328–331
  See application file for complete search history.

(56) References Cited

U.S. PATENT DOCUMENTS

| | | |
|---|---|---|
| 9,012,984 B2 | 4/2015 | Cheng et al. |
| 2004/0195618 A1 | 10/2004 | Saito et al. |
| 2010/0224932 A1 | 9/2010 | Takaya et al. |
| 2013/0001592 A1 | 1/2013 | Miyahara et al. |
| 2014/0145206 A1 | 5/2014 | Siemieniec et al. |
| 2014/0361349 A1* | 12/2014 | Alexandrov ........ H01L 29/8083 257/263 |
| 2015/0357415 A1* | 12/2015 | Kagawa ............ H01L 29/66068 257/77 |
| 2016/0005837 A1 | 1/2016 | Cheng et al. |
| 2017/0040425 A1* | 2/2017 | Kueck .................. H01L 29/408 |

OTHER PUBLICATIONS

R-Face SiC reference.: Toru Hiyoshi, Takeyoshi Masuda, Keiji Wada, Shin Harada, Takashi Tsuno and Yasuo Namikawa, SiC High Channel Mobility MOSFET, SEI Technical Review No. 77 Oct. 2013, pp. 122-126.

Notification of Transmittal of the International Search Report and the Written Opinion of the International Searching Authority, or the Declaration, corresponding to Application No. PCT/US2017/054212, dated Nov. 28, 2017, 17 pgs.

* cited by examiner

POWER SEMICONDUCTOR DEVICES HAVING GATE TRENCHES WITH IMPLANTED SIDEWALLS AND RELATED METHODS

STATEMENT OF U.S. GOVERNMENT INTEREST

This invention was made with Government support under Cooperative Agreement No. W911NF-12-2-0064 funded by the Army Research Laboratory. The Government has certain rights in the invention.

FIELD OF TIE INVENTION

The present invention relates to power semiconductor devices and, more particularly, to power semiconductor devices having gate trenches and to methods of fabricating such devices.

BACKGROUND

Power semiconductor devices are used to carry large currents and support high voltages. A wide variety of power semiconductor devices are known in the art including, for example, power Metal Oxide Semiconductor Field Effect Transistors ("MOSFET"), bipolar junction transistors ("BJTs"), Insulated Gate Bipolar Transistors ("IGBT"), Junction Barrier Schottky diodes, Gate Turn-Off Transistors ("GTO"), MOS-controlled thyristors and various other devices. These power semiconductor devices are generally fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than 1.40 eV.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, such as semiconductor substrates and/or semiconductor epitaxial layers.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complicated manufacturing process.

SUMMARY

Pursuant to embodiments of the present invention, semiconductor devices are provided that include a semiconductor layer structure comprising a drift region that includes a wide band-gap semiconductor material, the drift region having a first conductivity type. A gate trench is provided in an upper portion of the semiconductor layer structure, the gate trench having first and second opposed sidewalls that extend in a first direction in the upper portion of the semiconductor layer structure. In some embodiments where the wide band-gap semiconductor material is silicon carbide, the sidewalls of the gate trench may be oriented along a crystallographic plane of the silicon carbide semiconductor layer structure, such as the A-face {11-20} or M-face {1-100} family of planes that are oriented 90 degrees to the silicon-face (0001) plane of the silicon carbide, the silicon-face being a few degrees from the typical silicon carbide wafer surface plane. Alternately, the gate trench may be formed at a small angle from these family of planes, or near other planes such as the R-plane {0-33-8} family of planes. These devices further include a deep shielding pattern having a second conductivity type that is opposite the first conductivity type in the semiconductor layer structure underneath a bottom surface of the gate trench, and a deep shielding connection pattern that has the second conductivity type in the first sidewall of the gate trench. Finally, the devices include a semiconductor channel region that has the first conductivity type in the second sidewall of the gate trench.

In some embodiments, the semiconductor channel region may be in a portion of the second sidewall that is directly opposite a portion of the first sidewall that includes a portion of the deep shielding connection pattern.

In some embodiments, the semiconductor layer structure may further include a well region having the second conductivity type, and the deep shielding connection pattern may electrically connect the deep shielding pattern to the well region.

In some embodiments, the gate trench may be in an active region of the semiconductor device, and the semiconductor device may further include a termination region that surrounds the active region. The termination region may include a plurality of termination trenches in the upper portion of the semiconductor layer structure.

In some embodiments, the semiconductor device may further include a plurality of termination structures having the second conductivity type that are provided beneath the respective termination trenches.

In some embodiments, the termination structures may also extend into an inner sidewall but not an outer sidewall of a first portion of the respective termination trenches and may extend into the outer sidewall but not the inner sidewall of a second portion of the respective termination trenches.

In some embodiments, a bottom of the deep shielding pattern may be at approximately the same depth in the semiconductor layer structure as a bottom of each termination structure. In some embodiments, the termination structures may be guard rings.

In some embodiments, the first sidewall of the gate trench may be angled at an angle of less than eighty degrees with respect to the upper portion of the semiconductor layer structure.

In some embodiments, the deep shielding pattern may comprise a plurality of spaced apart deep shielding regions underneath the gate trench and the deep shielding connection pattern may comprise a plurality of spaced apart deep shielding connection regions in the first sidewall of the gate trench. The semiconductor channel region may be in a portion of the second sidewall that is opposite a portion of the first sidewall that is between first and second of the deep shielding connection regions.

In some embodiments, the deep shielding pattern may be a continuous deep shielding region that extends underneath the gate trench and the deep shielding connection pattern may be a continuous deep shielding connection region in the first sidewall of the gate trench.

In some embodiments, the wide band-gap semiconductor may be silicon carbide.

Pursuant to further embodiments of the present invention, semiconductor devices are provided that include a semiconductor layer structure that has an active and a termination region. The semiconductor layer structure includes a drift region that comprises a wide band-gap semiconductor material doped with dopants having a first conductivity type. A plurality of gate trenches are provided in the active region that are formed in an upper portion of the semiconductor layer structure, the gate trenches extending in a first direction and spaced apart from each other in a second direction that is perpendicular to the first direction. The semiconductor device further includes a plurality of deep shielding patterns doped with dopants having a second conductivity type that is opposite the first conductivity type, the deep shielding patterns located in the semiconductor layer structure underneath the respective gate trenches. The device also includes a plurality of termination trenches in the termination region that are formed in the upper portion of the semiconductor layer structure. Finally, the semiconductor device includes a plurality of termination structures doped with dopants having the second conductivity type, the termination structures located in the semiconductor layer structure underneath the respective termination trenches.

In some embodiments, each termination structure may also extend into at least one sidewall of the respective termination trenches.

In some embodiments, the semiconductor device may further include a plurality of deep shielding connection patterns that have the second conductivity type in first sidewalls of the respective gate trenches. Each deep shielding connection pattern may electrically connect a respective one of the deep shielding patterns to a common source contact.

In some embodiments, the semiconductor device may further include a plurality of semiconductor channel regions that have the first conductivity type in the second sidewalls of the respective gate trenches.

In some embodiments, each semiconductor channel region may be directly opposite a portion of the first sidewall that includes a portion of a respective one of the deep shielding connection patterns.

In some embodiments, the termination structures may extend into an inner sidewall but not an outer sidewall of a first portion of the respective termination trenches and into the outer sidewall but not the inner sidewall of a second portion of the respective termination trenches.

In some embodiments, a bottom of each deep shielding pattern may be at approximately the same depth in the semiconductor layer structure as a bottom of each termination structure.

In some embodiments, the wide band-gap semiconductor may be silicon carbide.

Pursuant to still further embodiments of the present invention, methods of forming a semiconductor device are provided in which a wide band-gap semiconductor layer structure is formed on a substrate, the semiconductor layer structure including a drift region that has a first conductivity type. A plurality of gate trenches are formed in an upper portion of the semiconductor layer structure, the gate trenches extending in a first direction and spaced apart from each other in a second direction that is perpendicular to the first direction, each gate trench having a bottom surface, a first sidewall that extends in the first direction and a second sidewall that extends in the first direction. Dopants having the second conductivity type that is opposite the first conductivity type are implanted into the bottom surfaces and the first sidewalls of the gate trenches.

In some embodiments, the dopants having the second conductivity type may be implanted into the first sidewalls of the gate trenches using an angled ion implant.

In some embodiments, the semiconductor device may be a vertical semiconductor device having a first source/drain contact on a first major surface of the semiconductor layer structure and a second source/drain contact on a second major surface of the semiconductor layer structure that is opposite the first major surface.

In some embodiments, the semiconductor layer structure may include a plurality of well regions having the second conductivity type between the gate trenches.

In some embodiments, the second conductivity dopants implanted into the bottom surfaces of the gate trenches may form a plurality of deep shielding patterns underneath the respective gate trenches, and the second conductivity dopants implanted into the first sidewall of the gate trenches may form a plurality of deep shielding connection patterns that electrically connect the deep shielding regions to the respective well regions.

In some embodiments, channel regions may be formed in the respective second sidewalls of the gate trenches.

In some embodiments, each channel region may be directly opposite a portion of a respective one of the deep shielding connection patterns.

In some embodiments, the well regions may be in the semiconductor layer structure, and the semiconductor layer structure may be formed in a single epitaxial growth process.

In some embodiments, the first sidewall of the gate trench may be angled at an angle of less than eighty degrees with respect to an upper portion of the semiconductor layer structure.

In some embodiments, a termination structure may be formed in a termination region of the semiconductor device. The termination structure may be formed by ion implantation simultaneously with the deep shielding patterns and the deep shielding connection patterns.

In some embodiments, forming the termination structure may comprise forming a plurality of termination trenches in the termination region; and implanting a bottom surface and a first sidewall of each termination trench with dopants having the second conductivity type.

In some embodiments, the bottom surfaces and first sidewalls of the termination trenches may be formed via an angled ion implant.

In some embodiments, a second angled ion implant may be performed to implant second conductivity type dopants into the second sidewalls of the gate trenches.

In some embodiments, each deep shielding pattern may comprise a plurality of spaced apart deep shielding regions underneath each gate trench.

DETAILED DESCRIPTION

Figure 1:
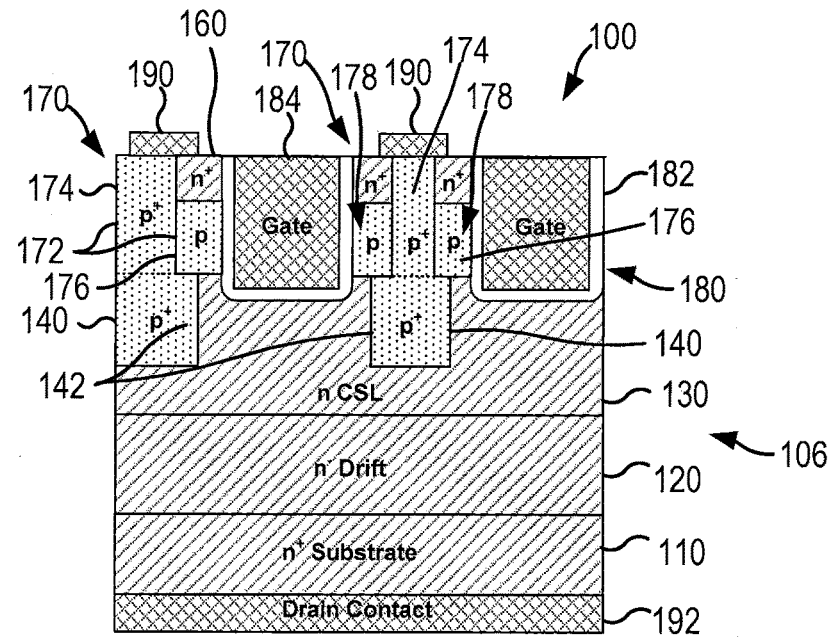
FIG. 1 is a schematic cross-sectional diagram of a first conventional gate trench power MOSFET.

One challenge in fabricating wide band-gap semiconductor power devices is that it may be more difficult to dope wide band-gap semiconductor materials with impurities to impart n-type or p-type conductivity in certain regions of the power semiconductor devices. This is particularly true in vertical power devices that include gate trenches, as it is often necessary to form regions having a first conductivity type within layers having a second conductivity type at deep levels within the device such as, for example, 1-5 microns or more from the upper surface of the device. This may pose challenges when the power semiconductor device is fabricated in silicon carbide or other wide band-gap semiconductor materials.

The primary methods for doping a semiconductor material with n-type and/or p-type dopants are (1) doping the semiconductor material during the growth thereof, (2) diffusing the dopants into the semiconductor material and (3) using ion implantation to selectively implant the dopants in the semiconductor material. When silicon carbide is doped during epitaxial growth, the dopants tend to unevenly accumulate, and hence the dopant concentration may vary by, for example, +/−15%, which can negatively affect device operation and/or reliability. Additionally, doping by diffusion is not an option in silicon carbide, gallium nitride and various wide band-gap semiconductor devices since n-type and p-type dopants tend to not diffuse well (or at all) in there materials, even at high temperatures.

Because of the above limitations, ion implantation is often used to dope wide band-gap semiconductor materials, such as silicon carbide. However, in gate-trench vertical power devices, it may be desirable to form deep shielding patterns underneath the well regions and/or gate electrodes of the device, and these deep shielding patterns often extend into the device to depths of 1-3 microns or more. The depth at which the ions are implanted is directly related to the energy of the implant, i.e., ions implanted into a semiconductor layer at higher energies tend to go deeper into the layer. Thus, forming deep shielding patterns via ion implantation requires high energy implants. When dopant ions are implanted into a semiconductor layer, the ions damage the crystal lattice of the semiconductor layer, and this damage typically can only be partly repaired by thermal annealing. Moreover, the amount of lattice damage is also directly related to the implant energy, with higher energy implants tending to cause more lattice damage than lower energy implants, and the uniformity of the ion implant also tends to decrease with increasing implant depth. Thus, to form implanted regions that have good doping uniformity by depth and/or acceptable levels of lattice damage, it may be necessary to perform a multiple successive epitaxial growth/ion implantation steps to form a deep implant. This may significantly increase the complexity and cost of the manufacturing process and may not be a commercially viable option in many instances.

Figure 2:
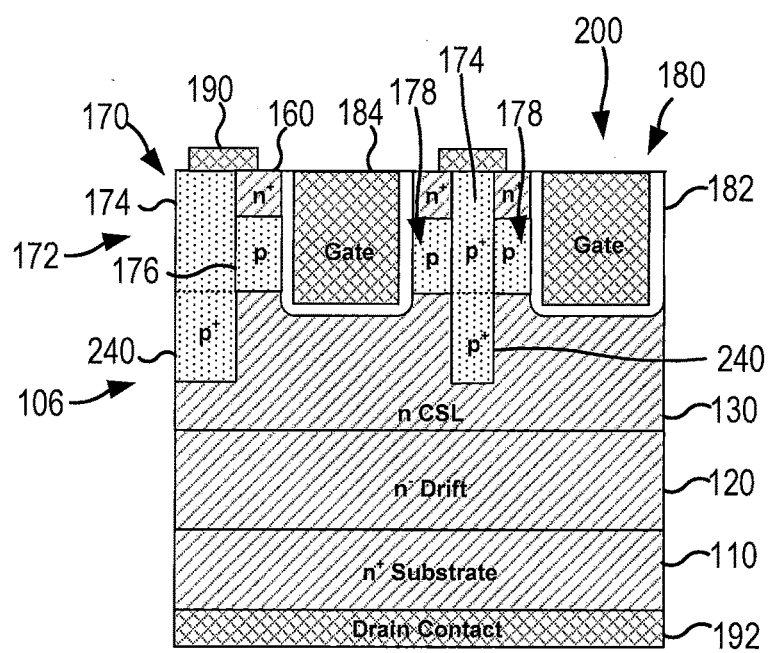
FIG. 2 is a schematic cross-sectional diagram of a second conventional gate trench power MOSFET.
Figure 3:
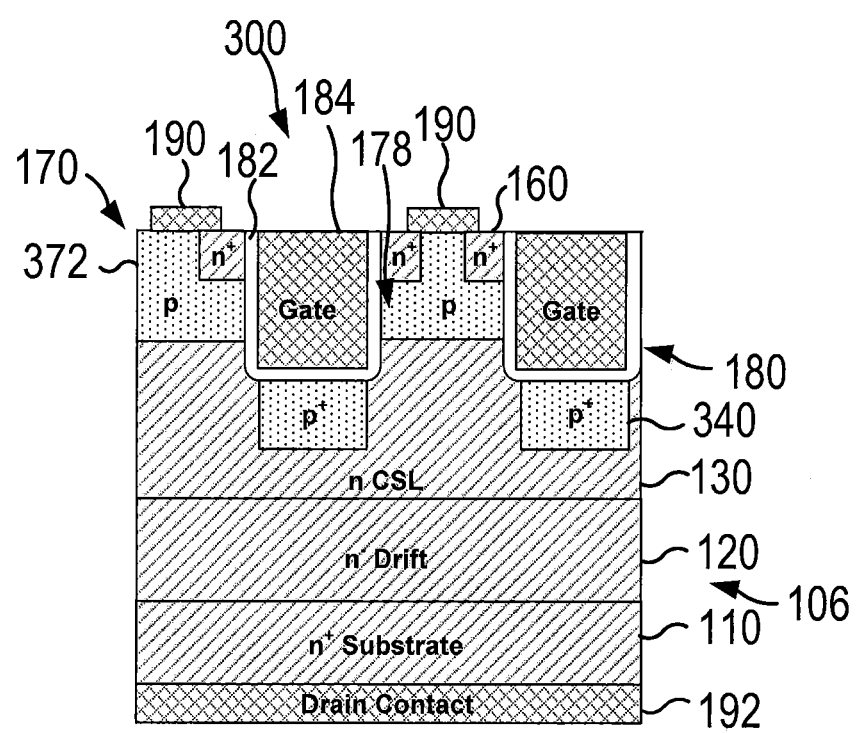
FIG. 3 is a schematic cross-sectional diagram of a third conventional gate trench power MOSFET.

Various approaches have been used conventionally to form deep shielding patterns in gate trench vertical power semiconductor devices. FIGS. 1-3 schematically illustrate several different approaches.

FIG. 1 is a schematic cross-sectional diagram of a first wide band-gap power MOSFET 100. As shown in FIG. 1, the power MOSFET 100 includes a heavily-doped (n$^+$) n-type silicon carbide substrate 110. A lightly-doped (n$^-$) silicon carbide drift region 120 is provided on the substrate 110. The upper portion of the n-type silicon carbide drift region 120 may be an n-type silicon carbide current spreading layer ("CSL") 130. The n-type silicon carbide current spreading layer 130 may be grown in the same processing step as the remainder of the n-type silicon carbide drift region 120 and may be considered to be part of the silicon carbide drift region 120. The n-type silicon carbide current spreading layer 130 may be a moderately-doped layer that has a doping concentration that exceeds the doping concentration of the remainder of the n-type silicon carbide drift region 120, which may be more lightly-doped n$^-$ silicon carbide.

Spaced apart heavily-doped (p$^+$) p-type silicon carbide deep shielding patterns 140 are formed in the upper surface of the n-type current spreading layer 130 by ion implantation. A moderately-doped p-type silicon carbide layer 170 is then formed by epitaxial growth on the upper surface of the n-type current spreading layer 130 and on top of the p$^+$ silicon carbide deep shielding patterns 140. This moderately-doped p-type silicon carbide layer 170 acts as the p-wells 172 for the device 100. Heavily-doped p$^+$ silicon carbide regions 174 are formed in the p-wells 172 via ion implantation that are electrically connected to the deep shielding patterns 140 thereunder. The p-wells 172 also include moderately-doped p-type regions 176 that are adjacent the heavily-doped regions 174. The p-type regions 174, 176 together form a p-well 172. The transistor channels may be formed in the moderately-doped regions 176 of the p-wells 172, as will be discussed below. The substrate 110, drift region 120 (including current spreading layer 130) and the moderately doped p-type layer 170, along with the various regions/patterns formed therein, comprises a semiconductor layer structure 106 of the MOSFET 100.

Gate trenches 180 are formed in the semiconductor layer structure 106. The gate trenches 180 extend through the moderately-doped p-type layer 170 to define the p-wells 172. A gate insulating layer 182 is formed on the bottom surface and sidewalls of each gate trench 180. A gate electrode 184 is formed on each gate insulating layer 182 to fill the respective gate trenches 180. Vertical channel regions 178 are provided in the p-wells 172 adjacent the gate insulating layer 182.

Heavily-doped n$^+$ silicon carbide source regions 160 are formed in upper portions of the p-wells 172 via ion implantation. Source contacts 190 are formed on the heavily-doped n-type source regions 160 and on the p-wells 172. A drain contact 192 is formed on the lower surface of the substrate 110. A gate contact (not shown) may be formed on each gate electrode 184.

The heavily-doped p$^+$ silicon carbide deep shielding patterns 140 include lower lateral extensions 142 that extend under the moderately-doped portions 176 of the p-wells 172. These lateral extensions 142 may help block the electric field during reverse blocking operation in order to protect the corners of the gate insulating layer 182 from high electric fields. If the gate insulating layer 182, which is typically implemented as a silicon oxide layer, is subjected to overly high electric fields, it can degrade over time and eventually fail to insulate the gate electrode 184 from the underlying current spreading layer 130, which can result in device failure.

The design of the above-described power MOSFET 100 has several potential short-comings. First, the p-wells 172 are typically doped during epitaxial growth so that the regions 174, 176 thereof may have different doping concentrations without the need for two separate p-type dopant ion implantation steps to form these regions. As discussed above, it may be difficult to maintain a consistent doping concentration when doping during epitaxial growth in wide band-gap semiconductor materials, and variations in the doping levels may result in degraded device performance and/or an increase in the likelihood of device failure. Second, an additional ion implantation step is required to form the heavily-doped p$^+$ regions 174 in the p-wells 172, which increases the manufacturing time and cost. Third, precise alignment is required during the formation of the gate trenches 180 and various other processing steps that occur after formation of the deep shielding patterns 140 to ensure that the gate trenches 180 and the heavily-doped p⁺ portions 174 of the p-wells 172 are properly aligned with respect to the deep shielding patterns 140 thereunder. Such precise alignment may be difficult to consistently achieve in a production setting, and when not achieved, may result in device failure.

FIG. 2 is a schematic cross-sectional diagram of a second conventional wide band-gap power MOSFET 200. As can be seen by comparing FIGS. 1 and 2, the power MOSFETs 100 and 200 are similar in design. Consequently, same or similar components of the two power MOSFETS 100, 200 have been labeled with the same reference numerals, and descriptions of these same/similar components will generally be omitted with respect to power MOSFET 200 since they have already been described above. The primary differences between the power MOSFETs 100 and 200 are that the heavily-doped p⁺ deep shielding patterns 240 that are included in power MOSFET 200 do not have the lateral extensions 142 that are included in the deep shielding patterns 140 of power MOSFET 100.

The power MOSFET 200 may be fabricated by growing layers 120, 130 and 170 in a single epitaxial growth process. A series of trenches are then formed in the upper surface of the device. Every other one of these trenches serves as a gate trench 180 in the completed device 200. A mask layer may then be formed on the device leaving the trenches that will not serve as gate trenches (i.e., every other trench) exposed, and an ion implantation process may be performed into the bottoms of these exposed trenches to form a plurality of heavily-doped p⁺ deep shielding patterns 240. An additional epitaxial growth process may be performed to fill the trenches that will not serve as gate trenches with semiconductor material in order to form the heavily-doped p⁺ regions 174 of the p-wells 172. An ion implantation step may then be performed to form the heavily-doped n⁺ source regions 160. Then, the gate insulating layers 182 and the gate electrodes 184 may be formed in the same manner described above with reference to the power MOSFET 100.

The design of the power MOSFET 200 overcomes various of the potential problems with the power MOSFET 100 that is described above. In particular, the MOSFET 200 avoids the alignment problem present in the fabrication of MOSFET 100, and does not require a separate ion implantation step to form the heavily-doped p⁺ regions 174 of the p-wells 172. One challenge, however, with the power MOSFET 200 is that it requires formation of twice as many trenches. Additionally, since the deep shielding patterns 240 in power MOSFET 200 do not include the lateral extensions 142 that are included in the deep shielding patterns 140 of MOSFET 100, the electric field blocking performance of the power MOSFET 200 may not be as good as the electric field blocking performance of power MOSFET 100.

FIG. 3 is a schematic cross-sectional diagram of a third conventional wide band-gap power MOSFET 300. The power MOSFET 300 is similar in design to the power MOSFETs 100, 200 described above. Consequently, same or similar components of the power MOSFETS 100, 200, 300 have been labeled with the same reference numerals, and descriptions of these same/similar components will generally be omitted with respect to power MOSFET 300.

The primary difference between the power MOSFETs 100, 200 and power MOSFET 300 is that the power MOSFET 300 includes deep shielding patterns 340 that are provided under each gate trench 180 as opposed to the deep shielding patterns 140, 240 that are provided under the p-wells 172 of power MOSFETs 100, 200. The deep shielding patterns 340 may be very effective in protecting the corners of the gate insulating layer 182 from high electric fields during reverse blocking operation. However, one potential problem with providing the deep shielding patterns 340 is that they need to be electrically connected to the p-wells 372, and it can be challenging to form a good electrical connection between the deep shielding pattern 340 and the p-wells 372. Moreover, forming this electrical connection typically requires additional processing steps and/or may take up additional "real estate" in the device structure which may, for example, reduce the number of unit cells that can be included in the device.

Pursuant to embodiments of the present invention, gate trench wide band-gap power semiconductor devices such as power MOSFETs and power IGBTs are provided that have deep trench shielding patterns underneath the gate trenches that have good electrical connections to the well regions that are generally simple to manufacture. In some embodiments, the gate trench wide band-gap power semiconductor devices may be formed using an angled ion implantation that, in a single implantation process, forms both (1) the deep shielding patterns under the gate trenches and (2) deep shielding connection patterns that electrically connect the deep shielding patterns to well regions of the device. The techniques according to embodiments of the present invention may also be used to form termination structures such as, for example, guard rings in the termination region of the device so that the termination structures will extend to the same depth within the semiconductor layer structure as the deep shielding patterns that are formed in the active region of the device. This may further improve the performance of the device.

In example embodiments, the deep shielding patterns according to embodiments of the present invention may be formed by performing an angled ion implant after the gate trenches are formed. The angled ion implantation step implants dopant ions into at least portions of both the bottom surface and one sidewall of each gate trench, while not implanting ions into the other sidewall of each gate trench. Since the dopant ions are implanted into the bottom surface of each gate trench, which may already be more than 1-2 microns deep into the semiconductor layer structure, the deep shielding patterns can readily be implanted to a desired depth, and typically can be implanted using relatively low ion implantation energies. This may reduce damage to the lattice structure and may provide a more precise and uniform doping concentration in the deep shielding patterns. Moreover, since the dopant ions are implanted into one sidewall of each gate trench to form deep shielding connection patterns therein, an electrical connection is formed from each deep shielding pattern to a nearby well region. The opposite sidewall of the gate trench may not be implanted, and hence a channel for the device is still provided on one side of each gate trench.

Pursuant to further embodiments, a pair of angled ion implantation steps may be performed to form the above-described deep shielding patterns and deep shielding connection patterns. The first angled implant may implant dopant ions into a first sidewall and a bottom surface of the gate trenches, and the second angled implant may implant dopant ions into a second sidewall and the bottom surface of the gate trenches. Thus, in these embodiments, deep shielding connection patterns may be formed on both sidewalls of each gate trench. In these embodiments, the deep shielding patterns and the deep shielding connection patterns that extend alongside and underneath each gate trench may be segmented to have a plurality of spaced apart deep shielding regions and deep shielding connection regions under each gate trench. Channel regions may be provided in between the segmented deep shielding regions and deep shielding connection regions.

In still further embodiments, the gate trenches may have sloped sidewalls. When the gate trenches have such sloped sidewalls, the deep shielding patterns and deep shielding connection patterns may be formed using a vertical (i.e., not angled) ion implantation process, since one or both sidewalls of the gate trenches may be implanted without using an angled ion implant. An angled ion implantation may also be used in these embodiments.

The new approaches for forming deep shielding patterns disclosed herein allows the formation of deep shielding patterns that are at least twice as close together as compared to the deep shielding patterns 240 that are included in the power MOSFET 200 described above, since the deep shielding patterns 240 are only formed in the bottom of every other trench. Thus, the devices according to embodiments of the present invention may exhibit better electric field blocking and on-state resistance performance as compared to devices formed using the technique discussed above with respect to the power MOSFET 200 of FIG. 2. Moreover, by forming the electrical connection between the deep shielding patterns below the gate trenches and the well regions in the same implantation step used to form the deep shielding patterns the problems discussed above with respect to the power MOSFET 300 of FIG. 3 in forming this electrical connection can be avoided. The approaches according to embodiments of the present invention also avoid the need for the additional epitaxial growth step that is required in fabrication of the power MOSFET 100 of FIG. 1 and the related alignment problems that occur when multiple epitaxial growth steps are performed. Additionally, the devices according to embodiments of the present invention form the deep shielding patterns directly below the gate trenches, where it may be more effective, which is not the case with the power MOSFETS 100, 200 of FIGS. 1-2 above.

Embodiments of the present invention will now be described with reference to FIGS. 4A-12. It will be appreciated that features of the different embodiments disclosed herein may be combined in any way to provide many additional embodiments. Thus, for example, features of any MOSFET embodiment described herein may be incorporated into any IGBT embodiments, and vice versa. As another example, each edge termination described herein may be used with any of the embodiments and not only with the embodiment that includes the specific edge termination. Thus, it will be appreciated that various features of the inventive concepts are described below with respect to specific examples, but that these features may be added to other embodiments and/or used in place of example features of other embodiments to provide many additional embodiments. Thus, the present invention should be understood to encompass these different combinations.

Figure 4A:
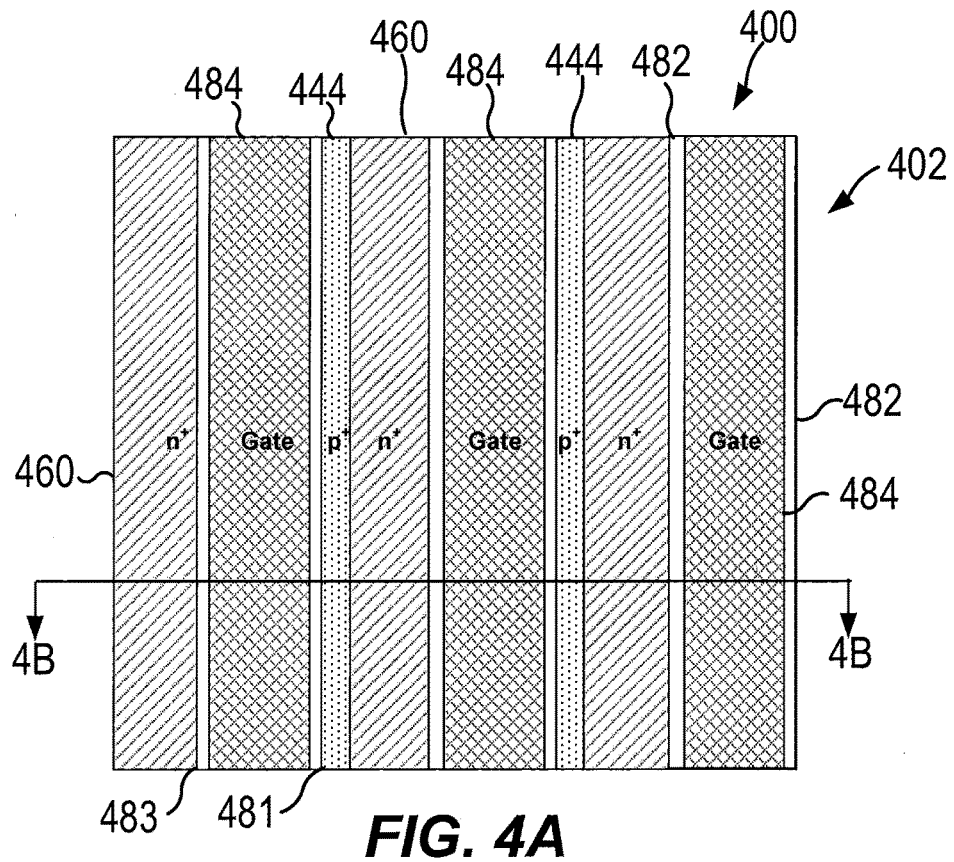
FIG. 4A is a schematic plan view of a portion of a gate trench power MOSFET according to embodiments of the present invention.
Figure 4B:
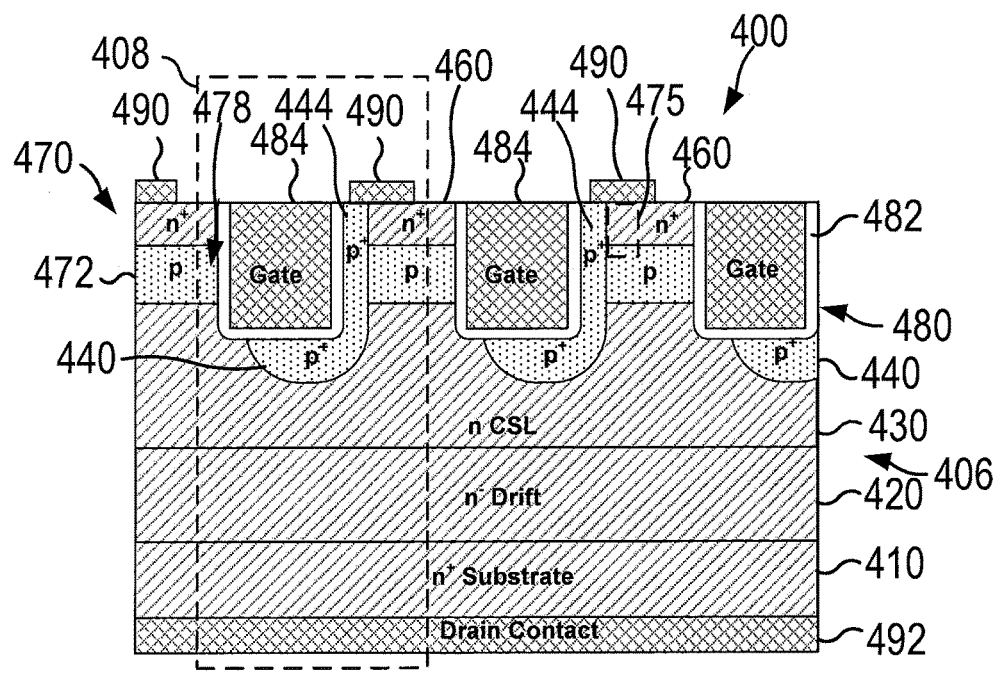
FIG. 4B is a schematic cross-sectional view of the gate trench power MOSFET of FIG. 4A taken along line 4B-4B of FIG. 4A.

FIG. 4A is a schematic plan view of a gate trench power MOSFET 400 according to embodiments of the present invention. In the plan view of FIG. 4A the source contacts 490 are omitted to better show the underlying semiconductor layers. FIG. 4B is a schematic cross-sectional view of the gate trench power MOSFET 400 taken along line 4B-4B of FIG. 4A. In FIGS. 4A and 4B any gate electrode/contact material that extends outside of the gate trenches has been omitted from the drawings to more clearly show other features of the MOSFET 400 and to simplify the drawings.

Referring first to FIG. 4A, the power MOSFET 400 includes an active region 402 and a termination region (not shown) that surrounds the active region 402. FIGS. 4A-4B depict a single power MOSFET 400 that includes a plurality of unit cells 408 that are disposed in parallel. One example unit cell 408 is shown by the dotted box in FIG. 4B. The power MOSFET 400 may include more unit cells 408 than the approximately three unit cells 408 shown in FIG. 4B. It will also be appreciated that a plurality of power MOSFETs 400 may be grown on a single wafer.

As shown in FIGS. 4A-4B, the power MOSFET 400 includes a heavily-doped (n$^+$) n-type wide band-gap semiconductor substrate 410. The substrate 410 may comprise, for example, a single crystal 411 silicon carbide semiconductor substrate. The substrate 410 may be doped with n-type impurities (e.g., an n$^+$ silicon carbide substrate). The impurities may comprise, for example, nitrogen or phosphorous. The doping concentration of the substrate 410 may be, for example, between $1\times10^{18}$ atoms/cm$^3$ and $1\times10^{21}$ atoms/cm$^3$ although other doping concentrations may be used. The substrate 410 may be any appropriate thickness (e.g., between 100 and 500 microns thick in some embodiments).

A lightly-doped (n) silicon carbide drift region 420 is provided on the substrate 410. The silicon carbide drift region 420 may be formed by epitaxial growth on the silicon carbide substrate 410. The silicon carbide drift region 420 may be a thick region, having a vertical height above the substrate 410 of, for example, 3-100 microns. An upper portion of the silicon carbide drift layer 420 may comprise an n-type silicon carbide current spreading layer 430. The current spreading layer 430 may be formed, for example, by epitaxial growth in order to provide a moderately-doped current spreading layer 430 that has a doping concentration that exceeds the doping concentration of the remainder of the more lightly-doped n$^-$ silicon carbide drift region 420. The more lightly doped portion of the silicon carbide drift region 420 may have a doping concentration of, for example, between $1\times10^6$ atoms/cm$^3$ and $5\times10^{17}$ atoms/cm$^3$, although other doping concentrations may be used. The current spreading layer 430 may have a doping concentration of, for example, between $1\times10^{17}$ atoms/cm$^3$ and $5\times10^{18}$ atoms/cm$^3$, although other doping concentrations may be used. In some embodiments, a doping concentration of the current spreading layer 430 may be at least an order of magnitude greater than a coping concentration of the more lightly doped portion of the silicon carbide drift region 420.

A moderately doped p-type silicon carbide layer 470 is formed on the current spreading layer 430. The moderately doped p-type silicon carbide layer 470 may formed during the same epitaxially growth step used to form the n-type current spreading layer 430, with the n-type dopant source gas turned off and a p-type dopant source gas turned on. In other embodiments, an undoped (or slightly doped) epitaxial layer may be grown via epitaxial growth on the current spreading layer 430 and then the moderately doped p-type silicon carbide layer 470 may be formed by implanting p-type dopant ions into this layer. The ion implantation approach requires an additional processing step, but may provide more consistent doping levels throughout the moderately doped p-type silicon carbide layer 470. The moderately doped p-type silicon carbide layer 470 may have a doping concentration of, for example, between $5\times10^{16}$/cm$^3$ and $5\times10^{17}$/cm$^3$. The layers 410, 420, 430, 470 may all be grown in a single epitaxial growth process with process stops to switch between n-type doping and p-type doping to form a semiconductor layer structure 406.

Heavily-doped (n$^+$) n-type silicon carbide source regions 460 may be formed in upper portions of moderately doped p-type silicon carbide layer 470. The n-type source regions 460 may be formed by, for example, ion implantation. The heavily-doped (n+) n-type silicon carbide regions 460 act as the source regions for the MOSFET 400. The drift region 420/current spreading layer 430 and the substrate 410 together act as a common drain region for the power MOSFET 400.

Gate trenches 480 are etched through (or beside) the n+ silicon carbide regions 460, through the moderately doped p-type silicon carbide layer 470, and into the upper surface of the n-type silicon carbide current spreading layer 430. The gate trenches 480 may convert the moderately doped p-type silicon carbide layer 470 into a plurality of p-type well regions ("p-wells") 472 that are provided between the gate trenches 480. The gate trenches 480 may have a U-shaped cross-section in some embodiments, as shown in FIG. 4B. The rounding of the bottom edges of the gate trenches 480 may help reduce the electrical fields at the bottom corners of the gate trenches 480. The rounded corners may be omitted in some embodiments.

Each gate trench 480 may have a first sidewall 481 and a second sidewall 483 that is opposite the first sidewall 481. The first and second sidewalls 481, 483 each extend in a first direction along the upper surface of the semiconductor layer structure 406. Each sidewall 481, 483 comprises a portion of the semiconductor layer structure 406 that defines a side portion of a gate trench 480 (i.e., slightly sloped sidewalls). The first and second sidewalls 481, 483 may be substantially vertical sidewalls in some embodiments, In other embodiments, the first and second sidewalls 481, 483 may have angles of slightly more than ninety degrees with respect to the bottom surface of the gate trenches 480. This increased angle may result, for example, from the etching process used to form the gate trenches 480 (as the top portions of the sidewalls may be etched away more than the bottom portions). In still other embodiments, the first and second sidewalls of the gate trenches may be intentionally designed to have sidewalls with more pronounced slopes as will be explained with reference to FIG. 5.

After the gate trenches 480 are formed, a mask is formed to protect the heavily-doped n+ source regions. Then, p-type dopants are implanted into the top surface of the device to form a plurality of heavily-doped deep shielding patterns 440 and a plurality of heavily-doped deep shielding connection patterns 444. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth.

The deep shielding patterns 440 are formed underneath the respective gate trenches 480 in the upper surface of the n-type drift region 420/current spreading layer 430 and the deep shielding connection patterns 444 are formed in first sidewalls 481 of the gate trenches 480. Each deep shielding connection pattern 444 may extend from a respective one of the deep shielding patterns 440, through a p-well 472 to the top surface of the semiconductor layer structure 406. Each deep shielding connection pattern 444 may electrically connect a respective one of the deep shielding patterns 440 to a respective p-well 472. The p-type silicon carbide shielding patterns 440 may extend to, for example, a depth of approximately 1-2 microns into the drift layer 420/current spreading layer 430, although other depths may be used (e.g., 0.5 to 3 microns or 1 to 3.5 microns). Each deep shielding pattern 440 may have an associated deep shielding connection pattern 444. The deep shielding patterns 440 and their associated deep shielding connection patterns 444 may extend in a first direction in which the gate trenches extend along the upper surface of the semiconductor layer structure 406. The deep shielding patterns 440 and their associated deep shielding connection patterns 444 may be spaced apart from each other in a second direction that is perpendicular to the first direction.

The deep shielding patterns 440 and the deep shielding connection patterns 444 may be formed using an angled ion implant in some embodiments. The implant angle α is defined as the angle at which the ions are implanted from an axis that is perpendicular to the upper surface of the device (see FIG. 9C). In some embodiments, the implant angle α may be small, such as between 2 and 15 degrees. In other embodiments, the implant angle α may be between 15 and 45 degrees. In still other embodiments, the implant angle α may be between 45 and 80 degrees. This may allow a deep p-type implant underneath most of each gate trench 480, while still ensuring that one sidewall 481 of each gate trench 480 is implanted while the other sidewall 483 is not. In some embodiments, the same mask layer that is used in etching the gate trenches 480 may be used as the ion implantation mask during the formation of the deep shielding patterns 440 and the deep shielding connection patterns 444. It will be appreciated that the angle of implantation a and/or the energy of the implant may be varied during the angled ion implant in order to achieve desired doping levels and doping depths both underneath the gate trenches 480 and into the first sidewalls 481 of the gate trenches 480. For example, the implant may have higher energies at lower implant angle(s) and lower energies at higher implant angle(s).

A gate insulating layer 482 such as a silicon oxide layer is formed on the bottom surface and sidewalls of each gate trench 480. A gate electrode 484 is formed on each gate insulating layer 482. Each gate electrode 484 may fill the remainder of its respective gate trench 480. The gate electrodes 484 may comprise, for example, a semiconductor gate electrode or a metal gate electrode. The orientation, size and shape of the gate trenches 480 may be selected to provide a desired balance between the channel resistance in the on-state and the voltage blocking performance in the off-state.

Source contacts 490 may be formed on top surfaces of the heavily-doped n-type source region 460 and the heavily-doped deep shielding connection patterns 444. The source contacts 490 may all be electrically connected to form a single source contact. A drain contact 492 may be formed on the lower surface of the substrate 410. The source and drain contacts 490, 492 may comprise, for example, metal contacts. A gate contact (not shown) may be electrically connected to each gate electrode 484.

A heavily-doped p-type region 475 may be formed in the upper portion of each p-well 472 between the deep shielding connection pattern and the source regions 460 (which reduces the width of the source regions 460). While the heavily-doped p-type region 475 is not included in the embodiment of FIGS. 4A-4B, a dotted box labelled 475 has been included in one of the unit cells 408 of FIG. 4B to illustrate where this region could be located in each unit cell when included. Such heavily-doped p-type regions 475 may be provided if, for example, the width of the deep shielding connection patterns 444 is not sufficiently wide to guarantee that each deep shielding connection pattern 444 will be in direct contact with an associated source contact 490.

Vertical channel regions 478 are formed in the p-wells 472 adjacent the gate insulating layer 482 along one side of each gate trench 480 (namely in the second sidewall 483 of each gate trench 480). Current may flow from the n-type source regions 460 through the channel regions 478 to the drift region 420/current spreading layer 430 when a voltage is applied to the gate electrodes 484. Channels are not provided on the other side of each gate electrode 484 (e.g., in the first sidewall 481 of each gate trench 480) as instead, p-type deep shielding connection patterns 444 are formed in the first sidewalls 481 that electrically connect the respective p-type deep shielding patterns 440 to the p-wells 472 and the source contacts 490.

The p-type silicon carbide deep shielding patterns 440 may help reduce the extent to which the electric field that forms in the drift region 420 when the device is operated in the reverse blocking state (i.e., when the device is turned off) extends upward toward the gate insulating layers 482. The electric field, if too high, may over time degrade lower portions of the gate insulating layers 482, which may eventually result in device failure.

The power MOSFET 400 may exhibit several advantages over conventional power MOSFET designs such as the power MOSFET designs discussed above with reference to FIGS. 1-3. First, the MOSFET 400 includes deep p-type shielding patterns 440 below the gate trenches 480. This may provide enhanced electric field blocking as compared to the power MOSFETs of FIGS. 1 and 2, which have deep shielding patterns that are under the p-wells instead of under the gate trenches. Second, the power MOSFET 400 may have good electrical connections in the form of deep shielding connection patterns 444 that extend between the p-type deep shielding patterns 440 and the p-wells 472 and source electrodes 490, and these connections may be formed in the same processing step used to form the p-type deep shielding patterns 440. Third, all of the epitaxial layers may be formed in the same step, which may simplify fabrication of the MOSFET 400 as compared to, for example, the power MOSFET 100 of FIG. 1 above. Fourth, the power MOSFET 400 has high conductivity p-type connection to the deep shielding patterns 440 within the active region 402 of the device 400. Fifth, the power MOSFET 400 requires only half the number of trenches as are required in the power MOSFET 200 of FIG. 2. Sixth, the power MOSFET 400 does not require precise alignment in the manner that the power MOSFET 100 requires.

The structure of the power MOSFET 400 may be particularly advantageous with respect to silicon carbide based MOSFETs that are formed on faces of the silicon carbide crystal that have high electron mobility which are perpendicular to the C-axis, such as the A-face {11-20} and the M-face {1-100}.

Figure 5:
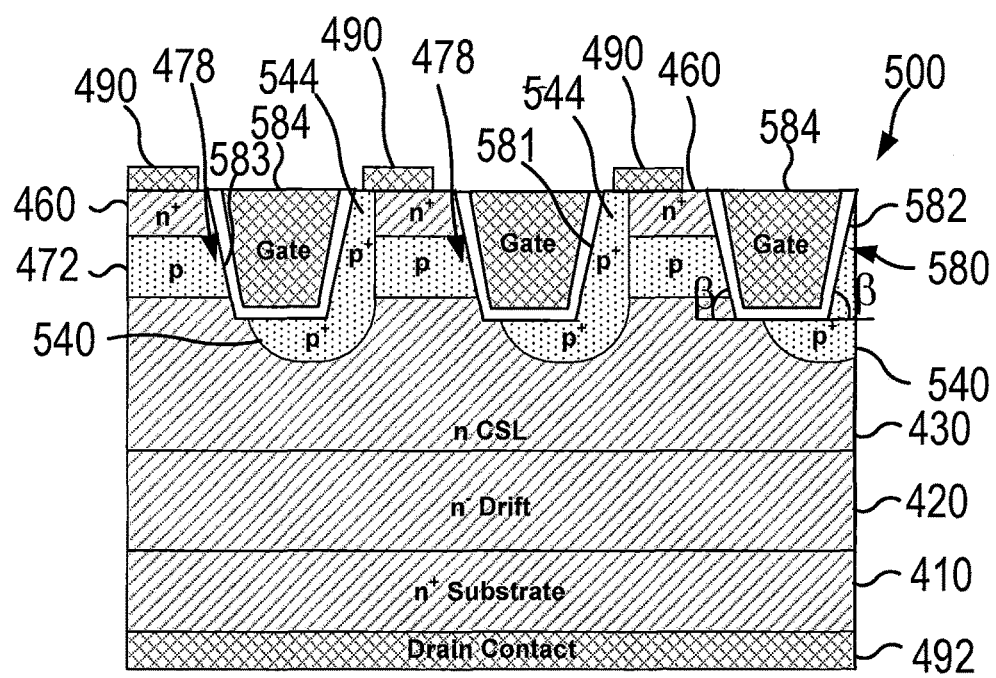
FIG. 5 is a schematic cross-sectional diagram of a gate trench power MOSFET according to further embodiments of the present invention that includes angled gate trenches.

FIG. 5 is a schematic cross-sectional diagram of a gate trench power MOSFET 500 according to further embodiments of the present invention. The power MOSFET 500 has V-shaped gate trenches 580 as opposed to the gate trenches 480 of power MOSFET 400 that have nearly vertical sidewalls. As the power MOSFET 500 is similar to the power MOSFET 400 discussed above with reference to FIGS. 4A-4B, like elements of power MOSFET 500 are numbered using the same reference numerals, and will not be discussed further below as they have already been described above. The discussion that follows will focus on the differences between the power MOSFET 500 and the power MOSFET 400.

As can be seen by comparing FIGS. 4B and 5, the primary difference between power MOSFETs 400 and 500 is that power MOSFET 500 includes V-shaped gate trenches 580 that have sloped first and second sidewalls 581, 583. The angle of each sidewall is defined herein as the angle β between the bottom surface of the gate trench 580 and the sidewall. Gate insulating layers 582 and gate electrodes 584 may be formed in the gate trenches 580. The gate insulating layers 582 and gate electrodes 584 may be identical to the gate insulating layers 482 and gate electrodes 484 that are described above with respect to the MOSFET 400 except that they have a different shape so as to conform to the gate trenches 580. The trenches 580 are narrower in width at the bottom and wider in width at the top. To form the power MOSFET 500, the ion implantation angle α that is used during the ion implantation step for forming the deep shielding patterns 540 and the deep shielding connection patterns 544 may be larger to ensure that the silicon carbide layer along the first sidewall 581 of the gate trench 580 is sufficiently implanted all the way to the top surface of the device. Additionally, the deep shielding patterns 540 and the deep shielding connection patterns 544 may be skewed more to one side than is the case with the deep shielding patterns 440 and the deep shielding connection patterns 444 that are included in the power MOSFET 400. Because of the larger implantation angle or, better electrical connections may be made to the deep shielding regions 540.

While, the power MOSFET 500 may be formed using an angled implant, in other embodiments, a perpendicular implant may be used where the implantation angle α is 0 degrees. The angled sidewalls 581, 583 of the gate trenches 580 allow implantation into the silicon carbide forming the first sidewall 581 of each gate trench 580. A mask may be used to prevent implantation into the second sidewalls 583 of each gate trench 580. One advantage of using an angled ion implant to form the deep shielding patterns 540 and the deep shielding connection patterns 544 is that when an angled ion implant is used the same mask that is used during the etching step that forms that gate trenches 580 may be used as the ion implantation mask. However, the complications that the angled implant may have on formation of an edge termination that are discussed below with reference to FIGS. 7A-7B may generally be avoided when a perpendicular implant is performed instead of an angled implant.

The structure of the power MOSFET 500 may be particularly advantageous with respect to silicon carbide based MOSFETs that are formed on faces of the silicon carbide crystal that have high electron mobility and that are not perpendicular to the C-axis, such as the R-face angled at 54.7 degrees.

In the embodiments of FIGS. 4A-4B and 5, the ion implantation angle α may involve a tradeoff between the width of the deep shielding patterns 440, 540 and the width of the deep shielding connection patterns 444, 544. If the implant angle α is selected to be just greater than the angle of the sidewalls of the gate trenches 480, 580 with respect to an axis that is perpendicular to the top surface of the device, then the width of the deep shielding patterns 440, 540 may be maximized, but little implantation will occur into the sidewall of the gate trenches 480, 580. Thus, the angle of implantation a is increased to obtain sufficient implantation into the sidewall in order to form the deep shielding connection patterns 444, 544, but this decreases the width of the deep shielding patterns 440, 540.

Figure 6A:
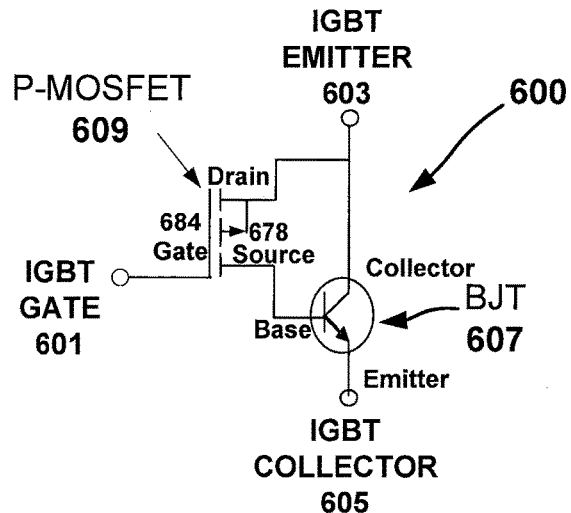
FIG. 6A is a simplified circuit diagram of a p-channel silicon carbide power insulated gate bipolar transistor ("IGBT") according to embodiments of the present invention.
Figure 6B:
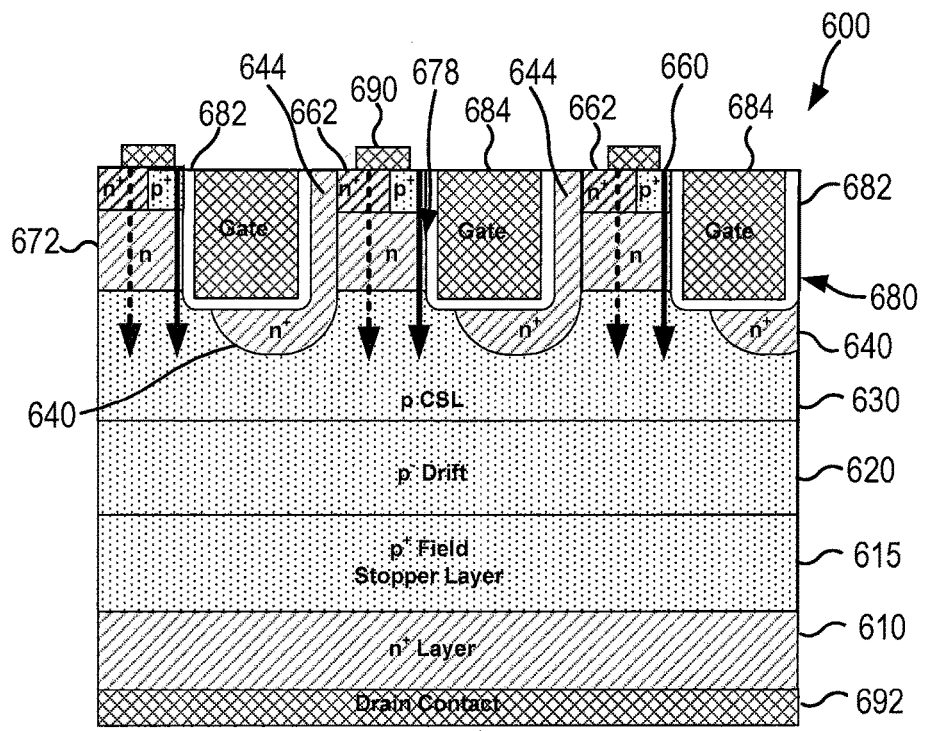
FIG. 6B is a schematic cross-sectional diagram of a unit cell of the IGBT of FIG. 6A.

FIG. 6A is a simplified circuit diagram of a p-channel silicon carbide power IGBT 600 according to embodiments of the present invention. FIG. 6B is a schematic cross-sectional diagram of the IGBT 600 of FIG. 6A.

As shown in FIG. 6A, the IOBT 600 includes an n-p-n silicon carbide power BJT 607 that has a base, an emitter and a collector. The IGBT 600 further includes a silicon carbide MOSFET 609 having a gate, a source and a drain. The source of the silicon carbide MOSFET 609 is electrically connected to the base of the silicon carbide power BJT 607, and the drain of the silicon carbide MOSFET 609 is electrically connected to the collector of the silicon carbide power BJT 607. By convention, the collector of the BJT 607 is the emitter 603 of the IGBT 600, and the emitter of the BJT 607 is the collector 605 of the IGBT 600, and the gate 684 of the MOSFET 609 is the gate 601 of the IGBT 600.

The IGBT 600 may operate as follows. An external drive circuit (not shown) is connected to the gate 601 of the IGBT 600 for applying a gate bias voltage to the MOSFET 609. When this external drive circuit applies a voltage to the gate 601 of IGBT 600 that is greater than the threshold voltage of the MOSFET 609, an inversion layer is formed in a semiconductor layer that is beside the gate 601 which acts as a channel 678 that electrically connects the p$^+$ emitter 603 of the IGBT 600 to the base of BJT 607. Note that the gate 601 of IGBT 600 is the gate 684 of MOSFET 609. Holes are injected from the p$^+$ emitter region 603 through the channel 676 into the base of BJT 607. This hole current acts as the base current that drives the BJT 607. In response to this hole current, electrons are injected from the collector 605 of IGBT 600 across the base of BJT 607 to the emitter 603 of IGBT 600. Thus, the silicon carbide MOSFET 609 converts the silicon carbide power BJT 607 from a current driven device to a voltage driven device, which may allow for a simplified external drive circuit. The silicon carbide MOSFET 609 acts as a driver transistor, and the silicon carbide power BJT 607 acts as the output transistor of the IGBT 600.

FIG. 6B is a schematic cross-sectional diagram of a portion of the IGBT 600 of FIG. 6A that illustrates several unit cells of the power IGBT 600. It will be appreciated that to form the power IGBT 600, typically a large number of unit cells are implemented in parallel. The IGBT 600 may also include a termination region. An example embodiment of a suitable termination region for power semiconductor devices according to embodiments of the present invention is discussed below with reference to FIGS. 7A-7B. It will be appreciated that the termination region shown in FIGS. 7A-7B may be included in the IGBT 600 of FIGS. 6A and 6B.

As shown in FIG. 6B, the IGBT 600 may be formed on, for example, a heavily-doped n$^+$ n-type silicon carbide layer 610. This n$^+$ silicon carbide layer 610 acts as the collector 605 of the IGBT 600 (and hence also as the emitter of the BJT 607). A p$^+$ silicon carbide field stopper layer 615 may optionally be provided on layer 610. A lightly doped (p$^-$) p-type silicon carbide drift layer 620 is provided on the field stopper layer 615. A moderately-doped p-type silicon carbide current spreading layer 630 is provided in the upper portion of the drift region 620. The p-type silicon carbide layers 615, 620, 630 act as the base of the BJT 607 and as the source region of the MOSFET 609. The silicon carbide layers 610, 615, 620, 630 may be formed via epitaxial growth on a substrate (not shown) that is subsequently removed.

A moderately-doped n-type silicon carbide layer 670 may be formed above the p-type silicon carbide current spreading layer 630 via epitaxial growth. This moderately-doped n-type silicon carbide layer 670 will be used to form a plurality of n-wells 672 in the device. Gate trenches 680 are formed in the moderately-doped n-type silicon carbide layer 670 to define the n-wells 672. The gate trenches 680 may also extend into the upper surface of the p-type current spreading layer 630. The gate trenches 680 may each have a U-shaped cross-section.

Heavily-doped n-type silicon carbide deep shielding patterns 640 are formed underneath each of the gate trenches 680, and heavily-doped n-type silicon carbide deep shielding connection patterns 644 are formed in the first sidewalls of the gate trenches 680. These regions 640, 644 may be formed using the angled ion implantation techniques according to embodiments of the present invention in the same manner that the regions 440, 444 of power MOSFET 400 are formed (except that regions 640, 644 are doped n-type instead of p-type). If the gate trenches 680 are instead formed to have sloped (non-vertical) sidewalls, then the deep shielding patterns 640 and the deep shielding connection patterns 644 can be formed using a vertical ion implantation step instead of an angled ion implantation as discussed above with reference to MOSFET 500.

Next, an upper portion of each n-well 672 may be doped by ion implantation to form a heavily-doped n$^+$ silicon carbide emitter region 662 (which also acts as the collector of the BJT 607). Heavily-doped (p$^+$) p-type silicon carbide drain regions 660 may be formed in upper portions of the n-wells 672 adjacent the respective heavily-doped n-type silicon carbide emitter regions 662 by ion implantation. Each p-type drain region 660 may be directly adjacent and contacting a respective one of the more heavily-doped n-type silicon carbide emitter region 662. The p$^+$ silicon carbide drain regions 660 act as a common drain for the IGBT 600. An ohmic contact 690 is formed to contact the n$^+$ silicon carbide emitter region 662 and the p$^+$ silicon carbide drain region 660, and an ohmic contact 692 is formed on the back side of the n$^+$ silicon carbide substrate 610.

A gate insulating layer 682 such as a silicon oxide layer is formed on the bottom surface and sidewalls of each gate trench 680. A gate electrode 684 that acts as the gate 601 of the IGBT 600 is formed on each gate insulating layer 682 to fill the respective gate trenches 680. The gate electrodes 684 may comprise, for example, a semiconductor gate electrode or a metal gate electrode. A gate contact (not shown) may be electrically connected to each gate electrode 684.

Vertical channel regions 678 of the MOSFET 609 are provided in the n-wells 672 adjacent one side of each gate electrode 684. These vertical channels 678 extend between the p$^+$ drain regions 660 and the p-type current spreading layer 630.

Operation of the IGBT 600 will now be discussed. When a bias voltage that exceeds the threshold voltage of the MOSFET 609 is applied to the gate 601, a hole current flows across the channels 678 of MOSFET 609 into the base of the BJT 607, as indicated by the solid bold arrows in FIG. 6B. In response to this base current, an electron current (shown by the dashed arrows in FIG. 6B) flows from the heavily-doped n-type emitter region 662 of the IGBT 600 through the n-wells 670 to the collector 605 of the IGBT 600.

While FIGS. 6A-6B illustrate a p-channel IGBT, it will be appreciated that n-channel IGBTs may also be provided pursuant to embodiments of the present invention. For example, the MOSFET 400 depicted in FIGS. 4A-4B could be converted into an n-channel IGBT according to embodiments of the present invention simply by replacing the n+ substrate 410 with a p-type semiconductor layer (e.g., a heavily doped p-type semiconductor layer).

Figure 7A:
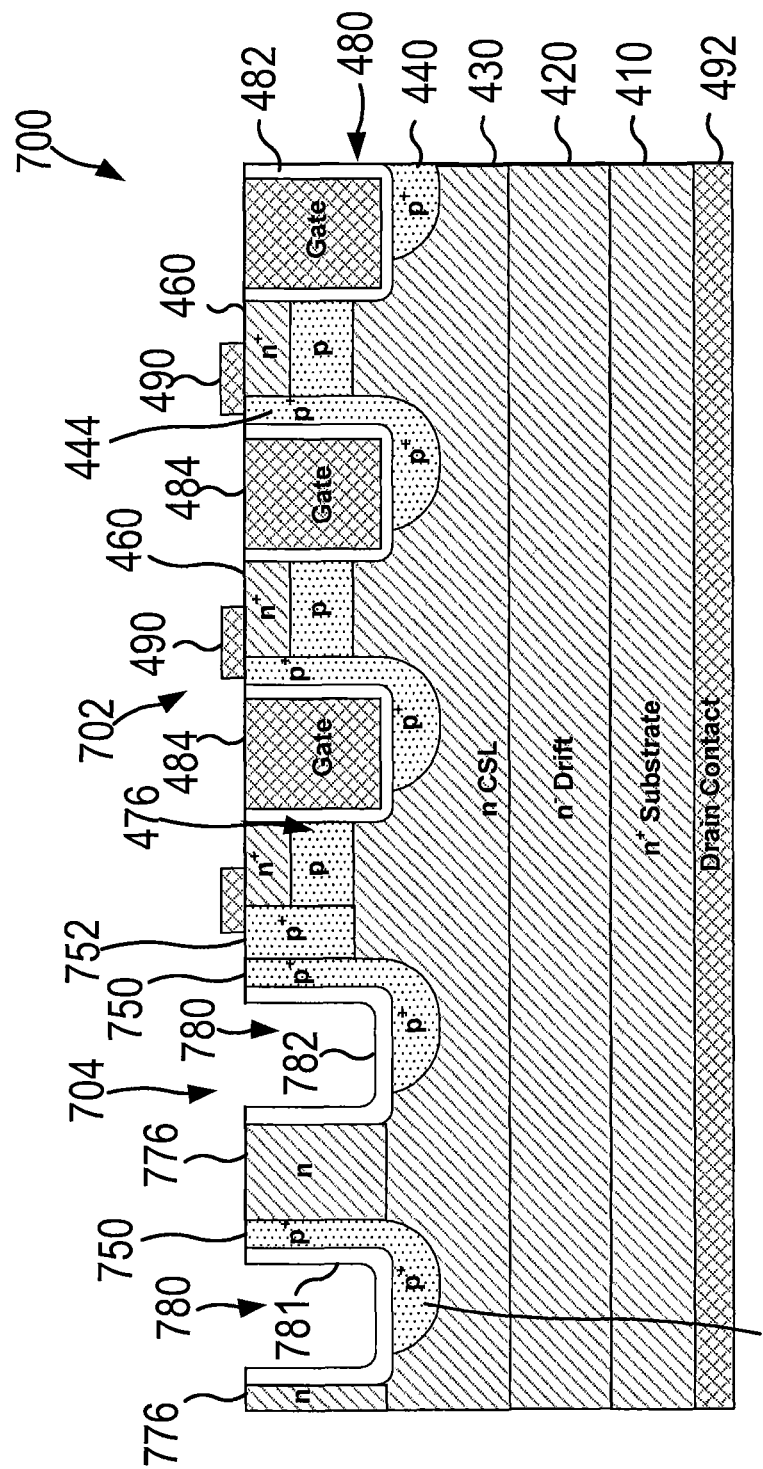
FIG. 7A is a schematic cross-sectional diagram of a gate trench power MOSFET according to still further embodiments of the present invention that illustrates an edge termination that is formed in a termination region of the device.

FIG. 7A is a schematic cross-sectional diagram of a gate trench power MOSFET 700 according to further embodiments of the present invention that illustrates an edge termination that is formed in a termination region 704 of the device. The power MOSFET 700 may be identical to the power MOSFET 400 described above, except that the power MOSFET 700 has a termination region 704 that includes a plurality of guard rings 750. The guard rings 750 may be formed underneath the bottom surfaces of termination trenches 780 that are formed in the termination region 704 of the MOSFET 700 and in first sidewalls 781 of the termination trenches 780. As the active region 702 of power MOSFET 700 may be identical to the active region 402 of power MOSFET 400 discussed above with reference to FIGS. 4A-4B, the discussion below will focus on the termination region 704 of the MOSFET 700. While the guard rings 750 are formed underneath and in sidewalls of the termination trenches 780 in this particular embodiment, as shown herein this need not be the case in other embodiments.

As shown in FIG. 7A, the power MOSFET 700 includes a plurality of guard rings 750 that are formed in the termination region 704 of the device. In the plan view of FIG. 7B, the lower portions of the guard rings 750 are underneath passivating insulating layers 782 that are formed in the termination trenches 780 and hence only the upper portion of each guard ring 750 that is formed in the first sidewall 781 of each termination trench 780 is visible. The termination trenches 780 may be formed simultaneously with the gate trenches 480 and the guard rings 750 may be formed simultaneously with the deep shielding patterns 440 and the deep shielding connection patterns 444. As a result, the guard rings 750 may extend the same depth into the current spreading layer 430 as the deep shielding patterns 440. Having the guard rings 750 (or other termination structure) extend to the same depth into the drift region 420/current spreading layer 430 as the deep shielding patterns 440 in the active region 702 of the device may provide improved blocking performance during reverse bias operation. As shown in FIG. 7A, in the termination region 704, the gate electrodes 484 and source contacts 490 that are provided in the active region 702 are omitted.

Figure 7B:
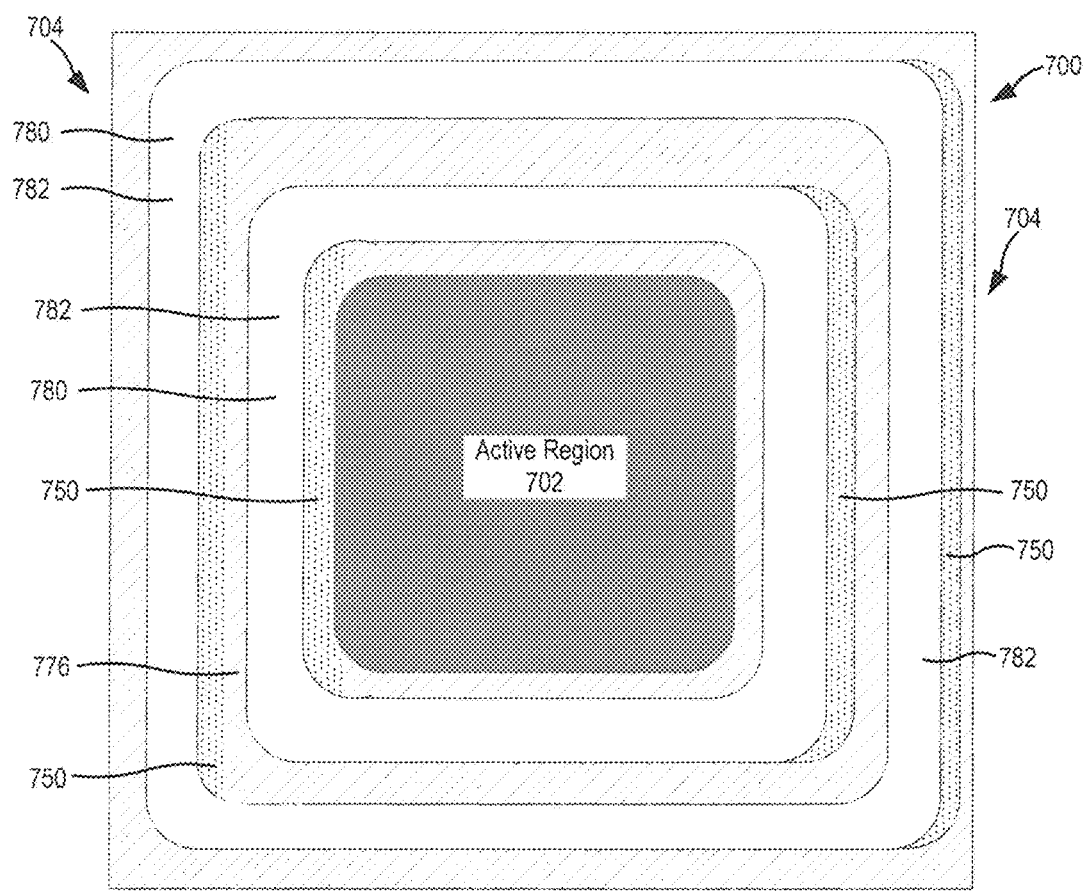
FIG. 7B is a schematic plan view of the gate trench power MOSFET of FIG. 7A that illustrates the edge termination of the device in further detail.

The guard rings 750 are formed in the termination region 704 to surround the active region 702. Thus, as shown in FIG. 7B, each guard ring 750 may have, for example, a generally circular or generally square shape when viewed from above. If the guard rings 750 have a generally square shape, the corners may be rounded to reduce electric field crowding. In order to form guard rings 750 that have such rounded corners, the termination trenches 780 may be formed to have rounded corners since the guard rings 750 are formed by implanting into the bottom surfaces and sidewalls of the termination trenches 780. The guard rings 750 may comprise edge termination structures. When a power semiconductor device such as the power MOSFET 700 is operated in the blocking state, leakage currents may begin to flow at the edges of the active region as the voltage is increased. Leakage currents tend to flow in these edge regions because electric field crowding effects at the edge of the device may result in increased electric fields in these regions. If the voltage on the device is increased past the breakdown voltage to a critical level, the increasing electric field may result in runaway generation of charge carriers within the semiconductor device, leading to avalanche breakdown. When avalanche breakdown occurs, the current increases sharply and may become uncontrollable, and an avalanche breakdown event may damage or destroy the semiconductor device.

In order to reduce this electric field crowding (and the resulting increased leakage currents), edge termination structures such as the guard rings 750 may be provided that surround part or all of the active region 702 of the power MOSFET 700. These edge termination structures may be designed to spread the electric field out over a greater area, thereby reducing the electric field crowding. Guard rings are one known type of edge termination structure. As shown in FIGS. 7A-7B, the guard rings 750 may comprise spaced-apart p-type regions in the n-type current spreading layer 430. While FIG. 7A illustrates a power MOSFET 700 that uses two guard rings 750 as an edge termination structure, it will be appreciated that different numbers of guard rings 750 may be used, and that other edge termination structures may be used. For example, in other embodiments, the guard rings 750 may be replaced with a junction termination extension. It will also be appreciated that the edge termination structure may be omitted in some embodiments.

In some embodiments, a second ion implantation step may be performed to tune the edge termination. The secondary ion implantation step may implant ions into the upper surface of the termination region 704 of the MOSFET 700. The secondary ion implantation step may implant either n-type or p-type dopant ions into the device depending upon the tuning necessary. As shown in FIG. 7A, the semiconductor regions 776 between the guard rings 750 may comprise n-type regions. As is also shown in FIG. 7A, a passivating insulating layer 782 may be applied in the termination region 704. The passivating insulating layer 782 may be formed simultaneously with the gate insulating layer 482. In some embodiments, each passivating insulating layer 782 may fill its respective termination trench 780. A heavily-doped p-type transition region 752 may be provided between the active region 702 and the termination region 704. The p-type transition region 752 may be formed by removing a portion of the mask during the ion implantation step that is performed to form the deep shielding regions 440 and the guard rings 750. It may also be formed by a separate implant in some embodiments.

FIG. 7B is a schematic plan view of the gate trench power MOSFET 700 of FIG. 7A that illustrates the structure of the termination region 704 of the device. In FIG. 7B the structural characteristics of the active region 702 are not illustrated and the active region 702 is depicted as being smaller than it would typically be in order to better illustrate details of the termination region 704.

As shown in FIG. 7B, two termination trenches 780 surround the active region 702. The termination trenches 780 may be formed in the upper surface of the semiconductor layer structure. The upper portion of the semiconductor layer structure may comprise, for example, an undoped semiconductor material or a lightly doped n-type or p-type semiconductor material. In the depicted embodiment, the uppermost portion of the semiconductor layer structure is lightly-doped n-type as grown.

As is further shown in FIG. 7B, the passivating insulating layer 782 is formed on the sidewalls and bottom surface of each termination trench 780 in the depicted embodiment. The passivating insulating layer 782 may be omitted in other embodiments, or replaced with a different material. As shown on the left side of FIG. 7A, the right sidewalls of the two termination trenches 780 are implanted with p-type dopants via the angled ion implant. As shown in the left side of FIG. 7B, the right sidewalls shown in FIG. 7A correspond to inner sidewalls of the respective termination trenches 780. As is shown, however, in the right side of FIG. 7B, on the opposite side of the active region 702, the angled ion implant again implants the p-type dopants into the right sidewall of the termination trenches 780, but on the left side of the device in FIG. 7B, the right sidewalls are the outer sidewalls of the termination trenches 780. Moreover, the sidewalls of the termination trenches 780 at the top and bottom of FIG. 7B may not be implanted on either side by the angled ion implantation step. This non-uniform implantation of the sidewalls is a result of the angled ion implantation on trenches that surround the active region 402.

In order for the guard rings 750 to operate properly, the locations of the portions of the termination trenches 780 that are on different sides of the active region 702 may be varied so that they are not the same on each of the four sides of the active region 702. For example, in the embodiment of FIGS. 7A-7B, the portions of termination trenches 780 on the right side of FIG. 7B may be located slightly closer to the active region 702 than the portions of the termination trenches 780 on the left side of FIG. 7B to account for the fact that the outer sidewalls of the portions of the termination trenches 780 are implanted on the right side of FIG. 7B and the inner sidewalls of the portions of the termination trenches 780 are implanted on the left side of FIG. 7B. The distance of the portions of the termination trenches 780 that are above and below the active region 702 in the plan view of FIG. 7B and/or the width of these portions of the termination trenches 780 may be made different from the distances and widths of the portions of the termination trenches 780 on the right and left sides of FIG. 7B to account for the fact that the sidewalls of the portions of the termination trenches 780 that are above and below the active region in FIG. 7B are not implanted. For example, the portions of the termination trenches 780 that are above and below the active region 780 may be wider than the portions of the termination trenches 780 on the right and left sides of FIG. 7B to achieve charge balance throughout the termination region 704.

In other embodiments, instead of forming termination trenches 780 in the termination region 704, a mesa etch may be performed throughout the termination region 704 so that the regions labelled 776 in FIG. 7A and the upper portions of the guard rings 750 are removed throughout the termination region 704 (and the active region 702 is a mesa that extends above the termination region 704). The mesa etch in the termination region 704 may be to the same depth as the etch of the gate trenches 480 in the active region 702. When this approach is taken, the termination region 704 may be masked with a mask pattern during the ion implantation step so that the guard rings 750 are formed in desired regions. The widths of the openings in the mask may not be symmetrical with respect to the active region 702 so that the guard rings 750 that are formed by the ion implantation step will be charged balance around the periphery of the active region 702.

Figure 13:
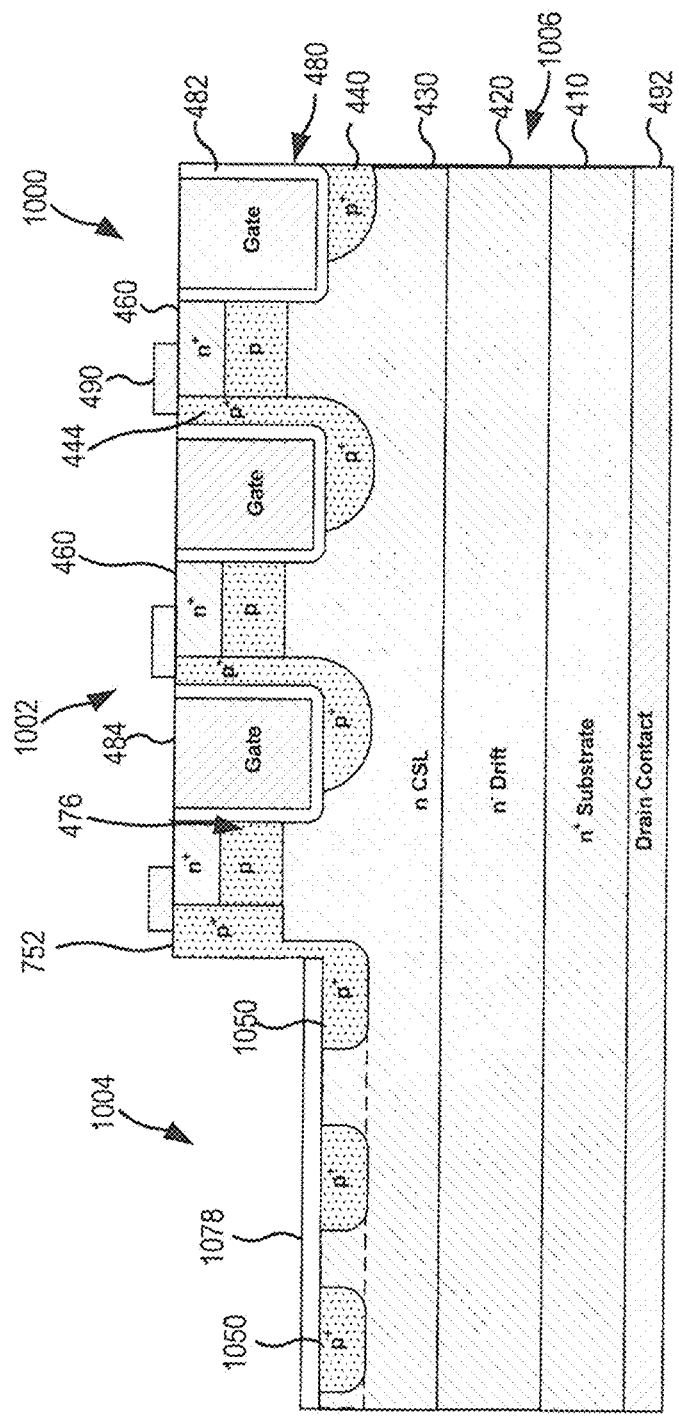
FIG. 13 is a schematic cross-sectional diagram of a gate trench power MOSFET according to further embodiments of the present invention that includes a guard ring edge termination formed using a mesa etch.
Figure 14:
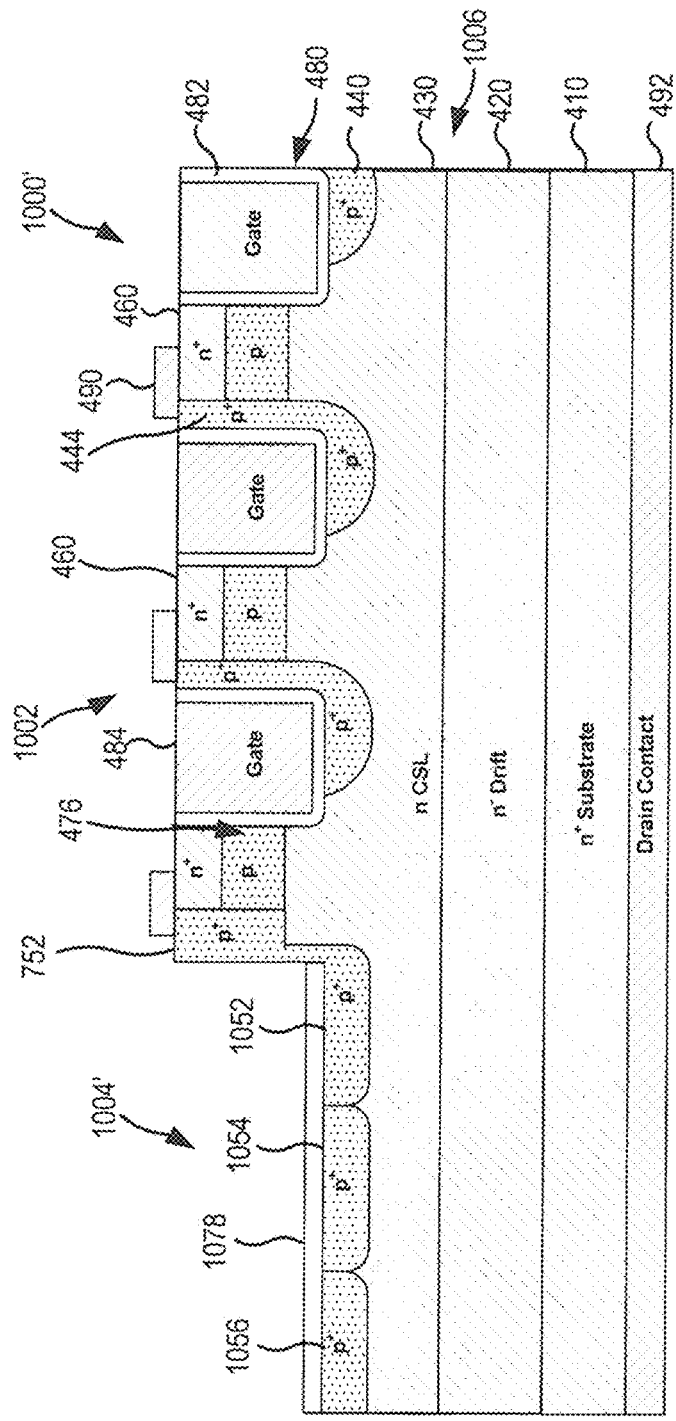
FIG. 14 is a schematic cross-sectional diagram of a gate trench power MOSFET according to yet further embodiments of the present invention that includes a junction termination extension edge termination formed using a mesa etch.

FIGS. 13-14 illustrate two example power MOSFETs according to further embodiments of the present invention in which the devices are formed by performing a mesa etch in the termination region. In particular, FIGS. 13 and 14 are schematic cross-sectional views of gate trench power MOSFETs having guard ring and junction termination extension edge terminations, respectively, that are formed after a mesa etch is performed throughout the termination regions of the devices.

Referring first to FIG. 13, a power MOSFET 1000 according to embodiments of the present invention is illustrated that may be similar to the power MOSFET 700 that is described above with reference to FIGS. 7A-7B. However, in the power MOSFET 1000, during the etching step that is used to form the gate trenches 480 in the active region 1002 of the device 1000 a so-called "mesa etch" is performed in the termination region 1004 of the device 1000 that may be used to completely etch away the upper portion of the semiconductor layer structure 1006 in the termination region 1004. Such an etching process is referred to as a mesa etch because after the etch is completed the active region 1002 is a mesa that rises above the surrounding termination region 1004.

The active region 1002 of power MOSFET 1000 may be identical to the active region 702 of power MOSFET 700, and hence further description thereof will be omitted herein. The termination region 1004 of MOSFET 1000, however, differs from the termination region 704 of MOSFET 700, as it does not include the termination trenches 780, nor does it include structures having implanted sidewalls with the exception of the sidewall of the mesa in which the active region 1002 is formed.

As shown in FIG. 13, the edge termination may comprise a plurality of guard rings 1050 that are formed to surround the active region 1002. The guard rings 1050 may have the general shape of the guard rings 1150 illustrated in FIG. 15 (see discussion below) in that the guard rings 1050 may surround the active region 1002, may have rounded corners, and may in some embodiments have a generally square or rectangular shape (with the rounded corners). A passivation layer 1078 such as, for example, a silicon oxide layer or a silicon nitride layer, may be formed over the guard rings 1050 in the termination region 1004 to protect the guard rings 1050.

One potential advantage of the power MOSFET 1000 as compared to the power MOSFET 700 is that it may be easier to determine the layout of the guard rings 1050 that will result in proper charge balance. While the implanted sidewalls of the termination trenches 780 in MOSFET 700 do not have a significant impact on the charge balance, they do have some effect, and this must be taken into account in the design of the guard rings 750. Additionally, the angled ion implant into the termination trenches 780 in the power MOSFET 700 impacts the width of the bottom of the implanted area, and does so differently in different regions of the termination region 704 (based upon whether the termination structure is parallel or perpendicular to the direction of tilt of the angled ion implant). Moreover, as discussed above with reference to FIG. 7B, the sidewalls of only some portions of the termination trenches 780 are implanted, which complicates the design. The absence of termination trenches and/or implanted sidewalls in the termination region 1004 of MOSFET 1000 may thus simplify the design thereof. Thus, when a mesa etch is performed in the termination region, it may be possible to use a completely symmetric edge termination (e.g., either guard rings or a junction termination extension) and still achieve acceptable charge balance.

FIG. 14 is a schematic cross-sectional view of a power MOSFET 1000' that is a slightly modified version of the power MOSFET 1000 of FIG. 13. As can be seen by comparing FIGS. 13 and 14, the difference is that MOSFET 1000' includes a junction termination extension edge termination in the termination region 1004' in place of the guard ring edge termination included in power MOSFET 1000. As known to those of skill in the art, a junction termination extension may be formed as a series of rings (e.g., square or rectangular rings having rounded corners when viewed from above) of first conductivity type material (here p-type) that are formed in the upper surface of a second conductivity type (here n-type) semiconductor layer structure in the termination region a device. The rings may have a decreasing concentration of the first conductivity type dopants with increasing distance from the active region. In the depicted embodiment, the junction termination extension comprises a total of three p-type implanted rings 1052, 1054, 1056 in the upper surface of the semiconductor layer structure 1006, with the inner ring 1052 having the highest concentration of p-type dopants and the outer ring 1056 having the lowest concentration of p-type dopants. More or fewer rings may be provided. As the MOSFET 1000' may otherwise be identical to the power MOSFET 1000, further description thereof will be omitted.

Figure 15:
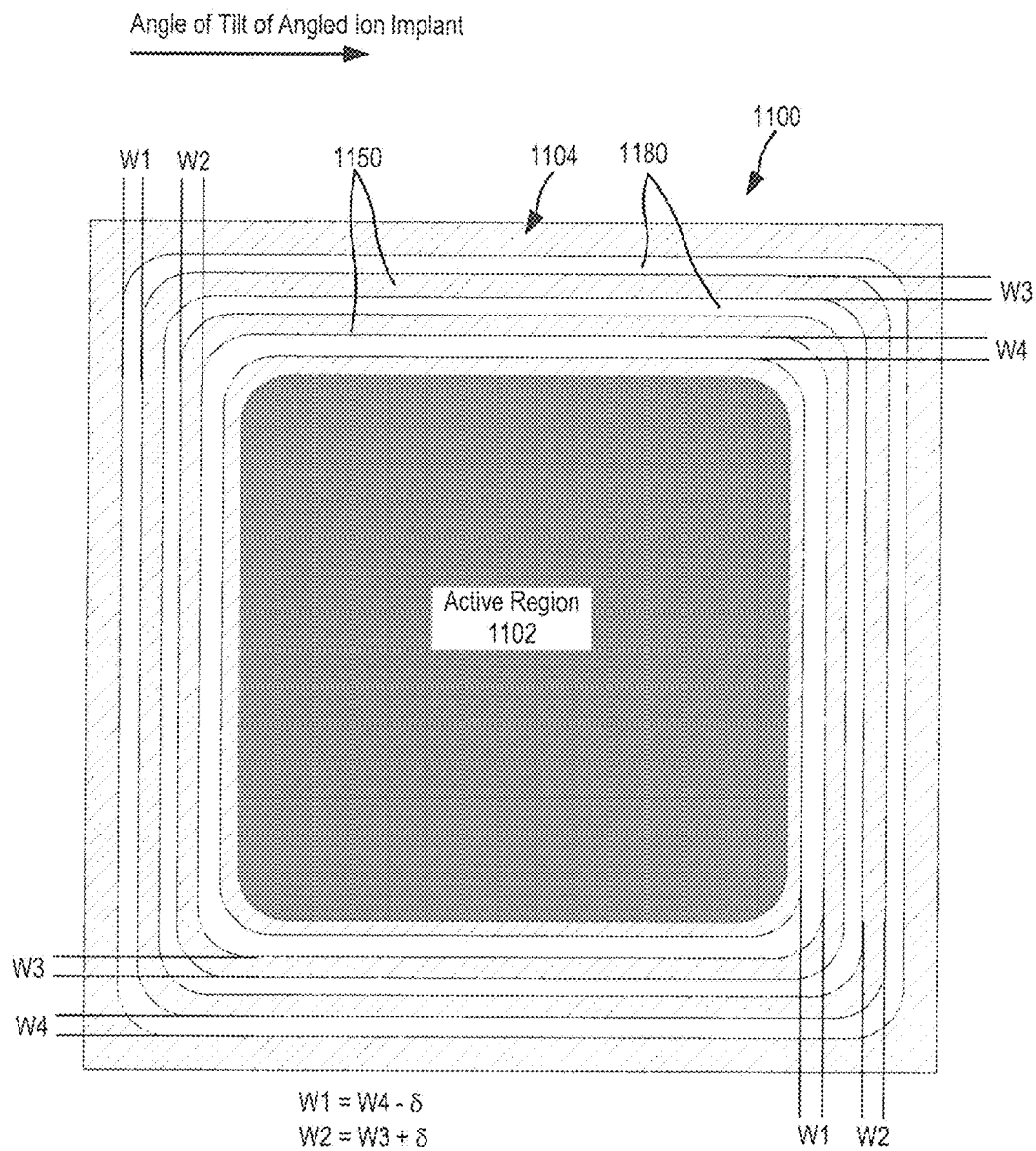
FIG. 15 is a plan view of a gate trench power MOSFET according to additional embodiments of the present invention that includes a guard ring edge termination.

FIG. 15 is a horizontal cross-section of a power MOSFET 1100 according to further embodiments of the present invention. The power MOSFET 1100 may have the general design of power MOSFET 700 of FIGS. 7A-7B above, and hence has guard rings 1150 that are formed below and in the sidewalls of termination trenches 1180. The horizontal cross-section of FIG. 15 is taken through the portions of the guard rings 1150 that are below the termination trenches 1180. The power MOSFET 1100 is formed using a single angled ion implant to form the deep shielding patterns (not shown) and guard rings 1150 thereof.

FIG. 15 illustrates how the widths of the guard rings 1150 may be varied to take into account the asymmetries associated with an angled ion implant. In particular, because an angled ion implant is used to implant the bottom surfaces of the termination trenches 780, the width of the portions of the guard rings 1150 that are perpendicular to the direction in which the ion implant is tilted may be decreased slightly. As shown in FIG. 15, the portions of the termination trenches 1180 that are above and below the active region in the view of FIG. 15 have a width W3, and the gaps between adjacent trenches 1180 in these portions of the termination region 1104 have a width W4. In order to accommodate for the slight decrease in the width of the portions of the guard rings 1150 that are perpendicular to the direction in which the ion implant is tilted, the portions of the termination trenches 1180 that are on the left and right sides of the active region 1102 are etched to have a slightly larger width W2 (W2=W3+δ, where δ is a positive number), and the gaps between adjacent termination trenches 1180 on the left and right sides of the active region 1102 have a slightly smaller width W1=W4−δ. This approach may be used to provide an equal distance between adjacent guard rings 1150 all the way around the termination region 1104.

If a pair of angled ion implants are performed (with the angled implants being tilted in opposite directions) instead of a single angled ion implant, as is discussed below with reference to the embodiment of FIGS. 10A-10C, then the effect of the double angled implant is to slightly increase the width of the portions of the guard rings 1150 that are perpendicular to the directions in which the ion implants are tilted. Consequently, when a double angled implant is used, the termination trenches 1180 may be formed to have the widths W2 and W3 shown in FIG. 15 except that δ is a negative number.

The power semiconductor devices 400, 500, 600 and 700 described above with reference to FIGS. 4A-7B each have deep shielding patterns and associated deep shielding connection patterns that extend linearly throughout the device. This can be seen, for example, in FIG. 4A where the deep shielding connection patterns 444 each extend linearly across the active region 402 alongside the gate trenches 480. It will be appreciated, however, that in other embodiments each of the power semiconductor devices 400, 500, 600 and 700 may be modified to have deep shielding patterns and associated deep shielding connection patterns that are segmented.

Figure 8:
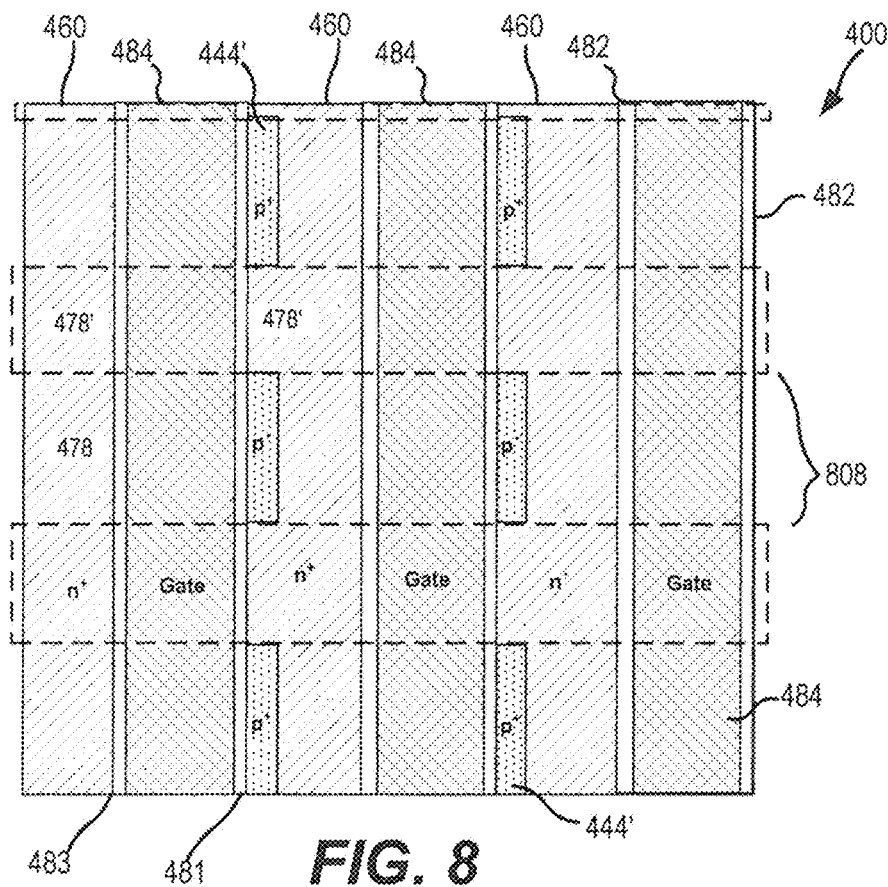
FIG. 8 is a plan view of a modified version of the power MOSFET of FIGS. 4A-4B.

As an example, FIG. 8 is a plan view of a power MOSFET 400' that is a is a modified version of the power MOSFET 400 of FIGS. 4A-4B. The one difference between power MOSFET 400 and power MOSFET 400' is that an additional mask pattern is used during the ion implantation step that is used to form the deep shielding patterns and the deep shielding connection patterns. The additional mask pattern that is added is shown in dotted lines as additional masking 808 in FIG. 8. As is readily apparent, the inclusion of the additional mask material breaks the deep shielding patterns and the deep shielding connection patterns into segments that are labeled deep shielding patterns 440' and deep shielding connection patterns 444' in FIG. 8. When this design is used, portions of the p-wells 472 on the sides of each deep shielding pattern 440' may be used as additional conducting channel regions 478', which may help lower the overall on-state resistance of the device. In other words, in the MOSFET 400' of FIG. 8, channels 478 are formed along the second sidewalls 483 of the gate trenches 480 just like in the MOSFET 400, and additional channel regions 478' are formed along both sidewalls 481, 483 of the gate trenches 480 in the regions between the deep shielding patterns 440' and the deep shielding connection patterns 444'. The channels 478, 478' would be directly below the reference numerals 478, 478' in FIG. 8. The exact same modification may also be made to the power semiconductor devices 500, 600 and 700 that are described above.

Figure 9A:
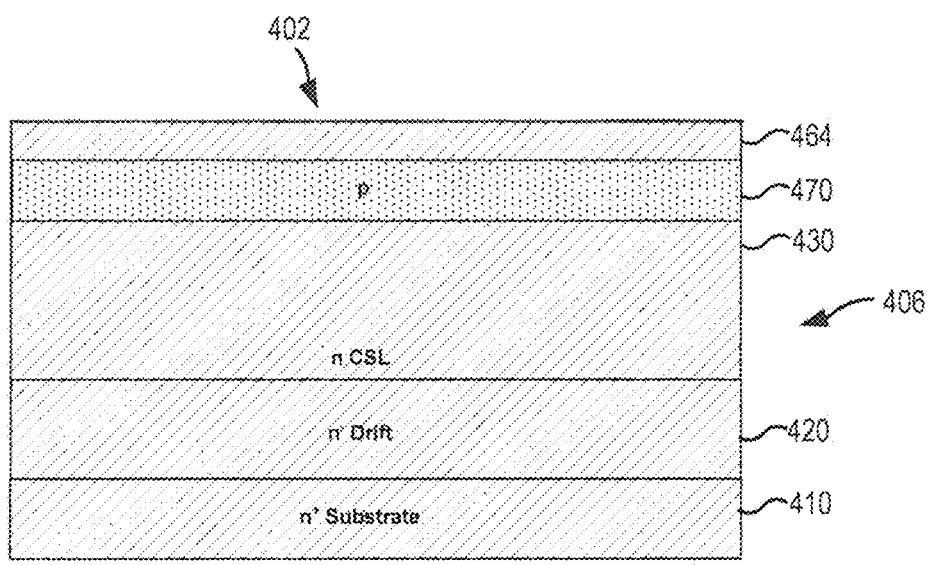
FIGS. 9A-9F are schematic cross-sectional diagrams that illustrate a method of fabricating the gate trench power MOSFET of FIGS. 4A-4B.

FIGS. 9A-9F are schematic cross-sectional diagrams that illustrate a method of fabricating the gate trench power MOSFET 400 of FIGS. 4A-4B. Referring first to FIG. 9A, a heavily-doped (n$^+$) n-type silicon carbide substrate 410 is provided that includes an active region 402 (only the active region 402 is shown). A lightly-doped (n$^−$) silicon carbide drift region 420 is formed on the substrate 410 via epitaxial growth. An n-type silicon carbide current spreading layer 430 is formed that comprises the upper portion of the n$^−$ silicon carbide drift layer 420. A moderately-doped p-type layer 470 is formed on the upper surface of the n-type silicon carbide current spreading layer 430. A silicon carbide layer 464 is formed on top of the moderately-doped p-type layer 470. The silicon carbide layer 464 may be an undoped layer in some embodiments. The layers 410, 420, 430, 470, 464 may all be grown in a single epitaxial growth process with process stops to switch between n-type doping and p-type doping to form a semiconductor layer structure 406.

Figure 9B:
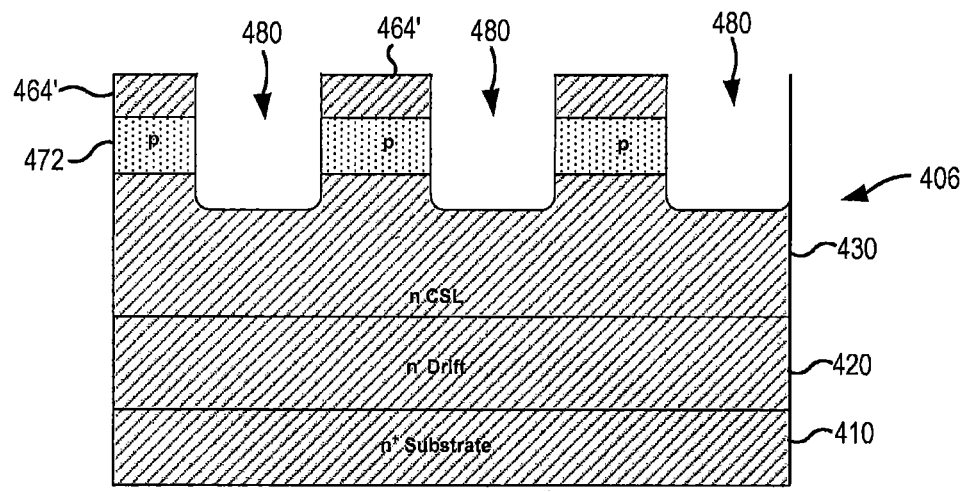

Referring to FIG. 9B, gate trenches 480 may be etched into the upper surface of the semiconductor layer structure 406. The gate trenches 480 may each extend in a first direction and may be spaced apart from each other in a second direction. The gate trenches 480 may extend in parallel to each other. Each gate trench 480 may extend through the heavily-doped n-type silicon carbide layer 464 in order to convert the silicon carbide layer 464 into a plurality of spaced apart regions 464' that will ultimately serve as the source regions 460 of the power MOSFET 400. Each gate trench 480 may also extend through the moderately-doped p-type silicon carbide layer 470 in order to convert layer 470 into a plurality of p-wells 472. Each gate trench 480 may also extend into an upper surface of the n-type current spreading layer 430. The gate trenches 480 may have U-shaped cross-sections in some embodiments.

Figure 9C:
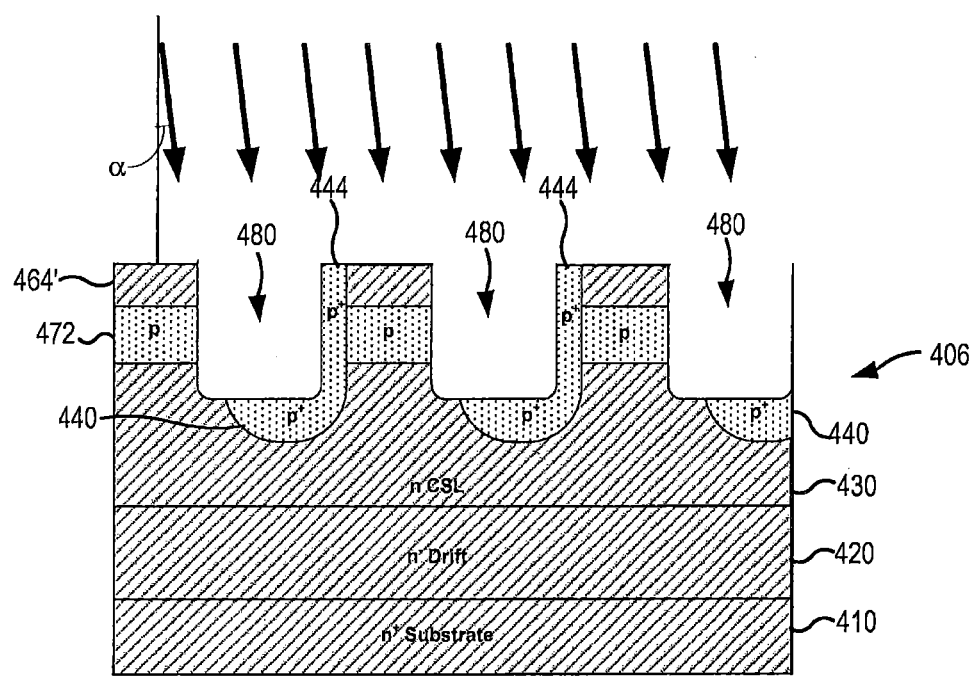

Referring to FIG. 9C, an angled ion implantation step may be performed to form a plurality of spaced apart heavily-doped p-type silicon carbide deep shielding patterns 440 underneath the respective gate trenches 480 and to form heavily-doped p-type deep shielding connection patterns 444 in first sidewalls of the gate trenches 480. The deep shielding connection patterns 444 electrically connect the p-type silicon carbide deep shielding patterns 440 to (among other things) the p-wells 472. The heavily-doped p-type deep shielding connection patterns 444 may extend to the upper surface of the device.

Figure 9D:
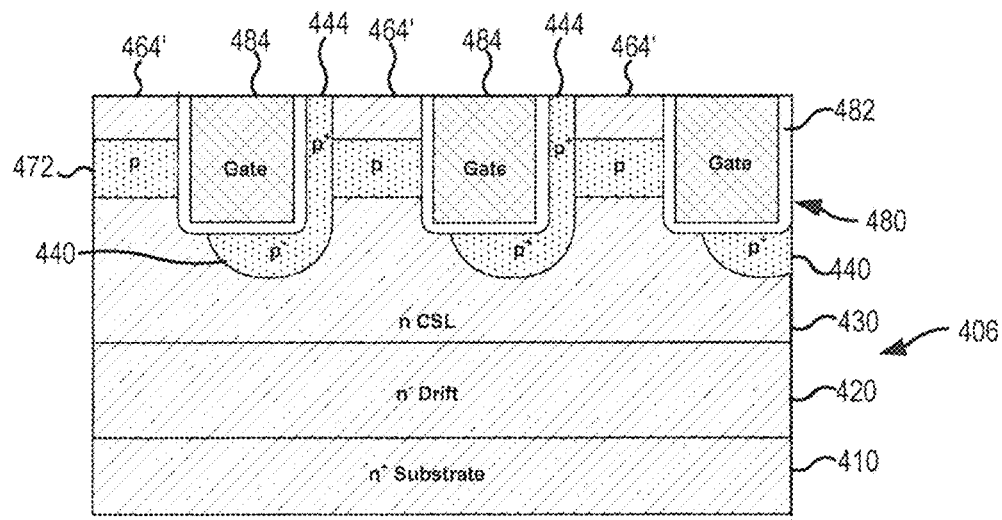

Next, referring to FIG. 9D, a gate insulating layer 482 such as a silicon oxide layer is formed on the bottom surface and sidewalls of each gate trench 480. A gate electrode 484 is formed on each gate insulating layer 482. Each gate electrode 484 may fill the remainder of its respective gate trench 480.

Figure 9E:
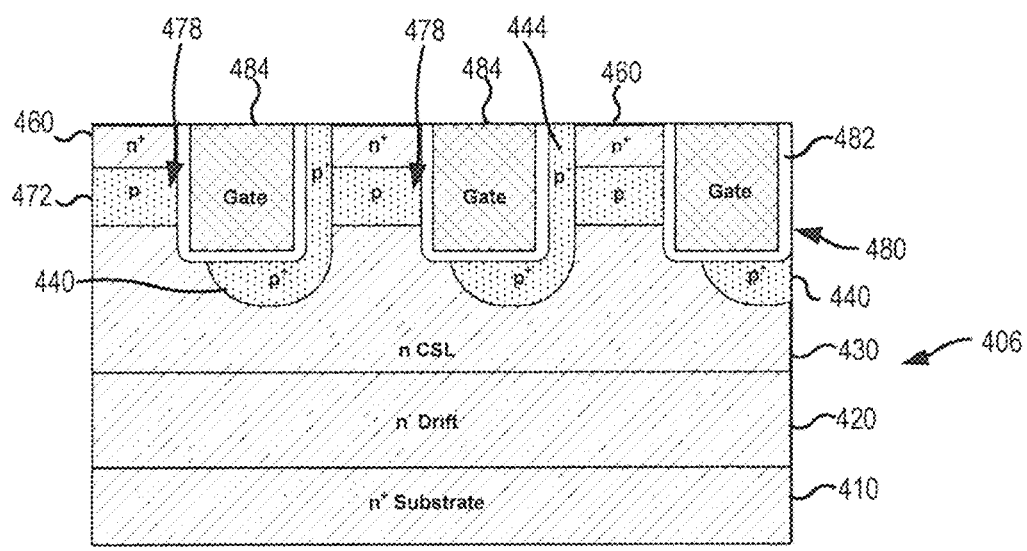

Next, referring to FIG. 9E, another ion implantation step is performed to convert the undoped regions 464' into heavily doped (n⁺) n-type silicon carbide source regions 460. Vertical channel regions 478 are provided in the p-wells 472 adjacent one side of each gate trench 480 (the left side in FIG. 9E). The channel regions 478 extend between the heavily doped (n⁺) n-type silicon carbide source regions 460 and the n-type silicon carbide current spreading layer 430.

Figure 9F:
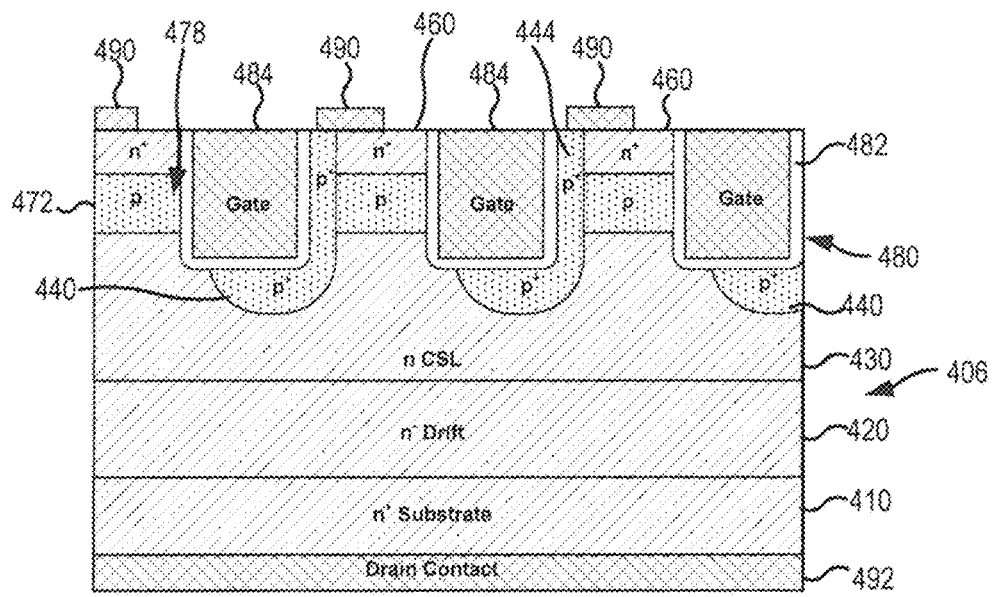

Referring to FIG. 9F, source contacts 490 are formed on the heavily-doped n-type source region 460 and on the heavily-doped p-type deep shielding connection patterns 444. A drain contact 492 is formed on the lower surface of the substrate 410 to complete the device.

While the fabrication steps are set forth in one example order in the discussion above, it will be appreciated that the fabrication steps may be performed in a different order. For example, the order of the various etching and ion implantation steps may be changed from what is described above.

Figure 10A:
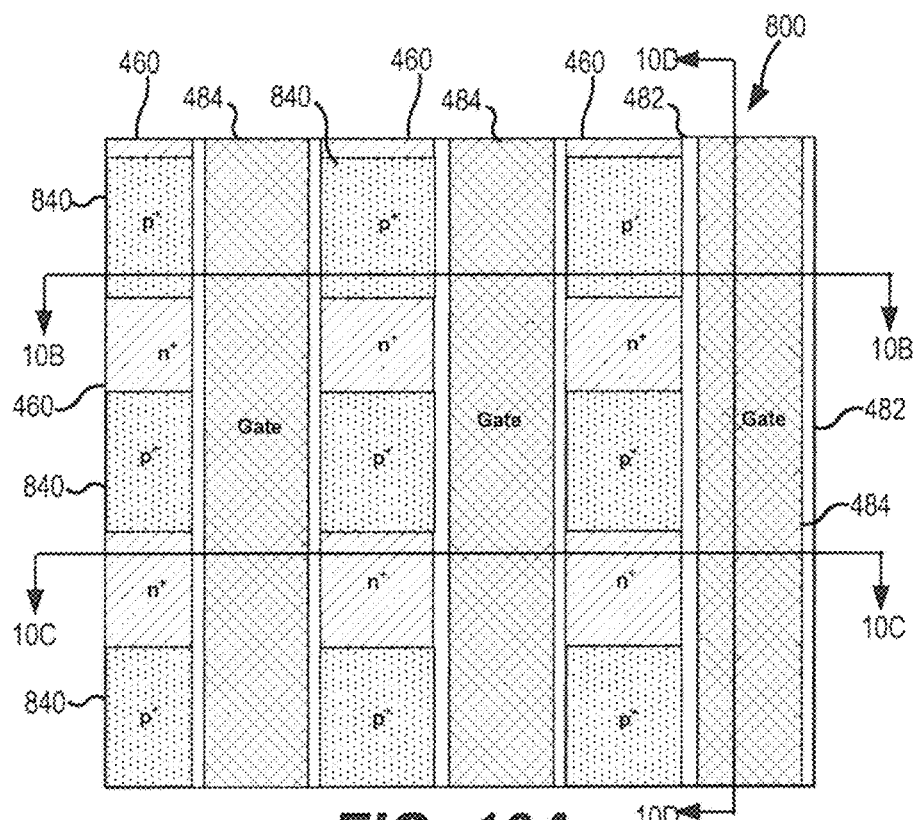
FIG. 10A is a schematic plan view of a portion of a gate trench power MOSFET according to further embodiments of the present invention.
Figure 10B:
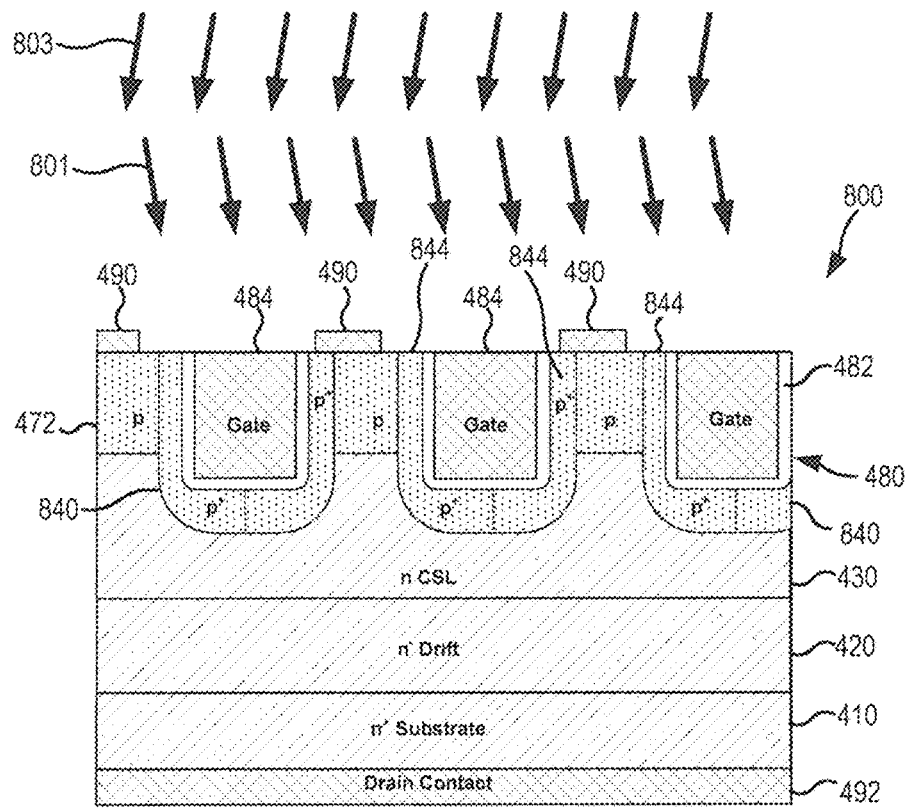
FIG. 10B is a schematic cross-sectional view of the gate trench power MOSFET of FIG. 10A taken along line 10B-10B of FIG. 10A.
Figure 10C:
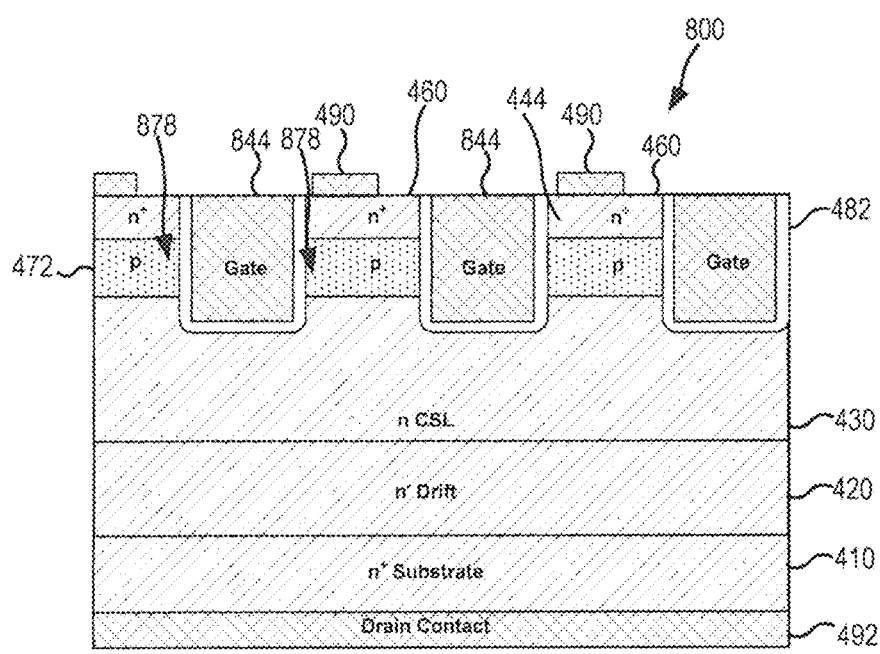
FIG. 10C is a schematic cross-sectional view of the gate trench power MOSFET of FIG. 10A taken along line 10C-10C of FIG. 10A.
Figure 10D:
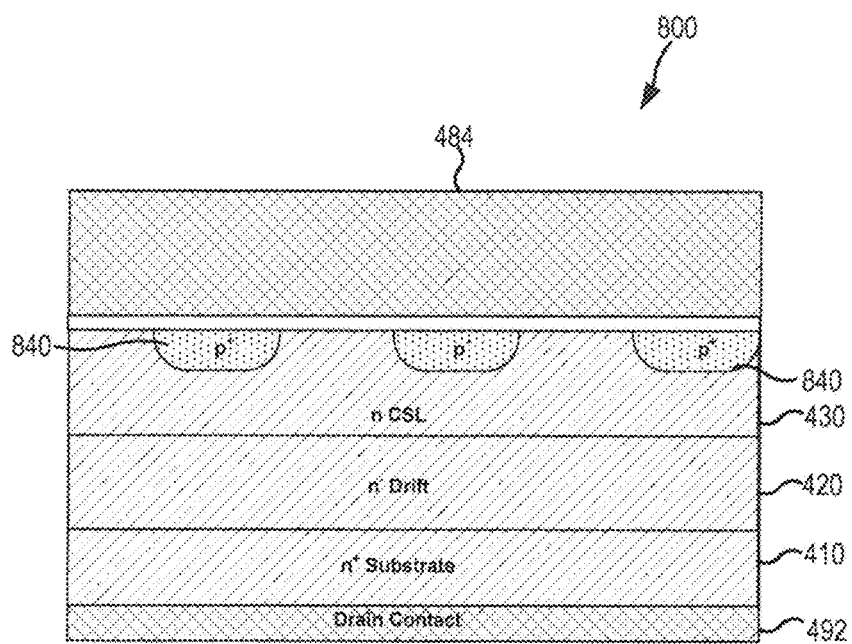
FIG. 10D is a schematic cross-sectional view of the gate trench power MOSFET of FIG. 10A taken along line 10D-10D of FIG. 10A.

FIGS. 10A-10D illustrate a power MOSFET 800 according to further embodiments of the present invention. In particular, FIG. 10A is a schematic plan view of a portion of the power MOSFET 800, and FIGS. 10B, 10C and 10D are a schematic cross-sectional views of the power MOSFET 800 taken along lines 10B-10B, 10C-10C and 10D-10D of FIG. 10A, respectively.

Referring to FIGS. 10A-10D, the power MOSFET 800 is similar to the power MOSFET 400' of FIG. 8. In particular, the power MOSFET 800 includes deep shielding patterns 840 that are formed in horizontal stripes across the device (when the device is oriented as shown in FIG. 10A). During the ion implantation step used to form the deep shielding patterns 840, a mask comprising horizontal stripes is placed over the active region so that the deep shielding patterns 440 and deep shielding connection patterns 444 that extend underneath/alongside each gate trench 480 in MOSFET 400 are instead segmented so that a plurality of deep shielding regions 840 and deep shielding connection patterns 844 are provided underneath/alongside each gate trench 480. Moreover, a pair of angled ion implants are performed so that deep shielding connection patterns 844 are formed in both sidewalls of each gate trench 480. The channels of the MOSFET 800 are formed underneath these masked regions (i.e., in the regions between deep shielding patterns 840 and deep shielding connection patterns 844 that are adjacent each other along the direction of the gate trenches 480), as will be discussed in more detail below with reference to FIGS. 10C and 10D.

As noted above, one of the primary differences between the power MOSFET 800 and the power MOSFET 400' is that a pair of angled implants are performed during the fabrication of power MOSFET 800. This is shown schematically in FIG. 10B, where the arrows labelled 801 represent a first implant that is used to form first portions of the deep shielding patterns 840 and the deep shielding connection patterns 844 (herein, the "first deep implant") and the arrows labelled 803 represent the second implant that is used to form second portions of the deep shielding patterns 840 and the deep shielding connection patterns 844 (herein, the "second deep implant"). The first deep implant may be used to implant p-type dopants into the portion of the current spreading layer 430 under the right side of each gate trench 480 and into the right sidewall of each gate trench 480, while the second deep implant may be used to implant p-type dopants into the portion of the current spreading layer 430 under the left side of each gate trench 480 and into the right sidewall of each gate trench 480. The vertical dotted lines included in each deep shielding pattern 840 are used to approximately divide the respective portions of the deep shielding patterns 840 that are formed by the respective first and second deep implants.

As noted above, the deep shielding patterns 840 are segmented into spaced-apart regions instead of extending continuously along the gate trenches 480 as is the case in the embodiment of FIGS. 4A-4B. Channel regions 878 are formed in the device between the deep shielding patterns 840, as can be seen in the cross-section of FIG. 10C. The channels 878 are formed on both sides of the gate trenches 480, as shown. While the deep shielding patterns 840 do not extend under the gate trenches 480 in the regions of the device where the channels 878 are formed, the provision of the deep shielding patterns 840 under other portions of the gate trenches 480 may protect the gate insulating layer 482 from excessive electric fields during reverse blocking operation. It should be noted that while the first and second implants are angled in a first direction that extends perpendicular to the gate trenches 480 (see FIG. 10B) in order to implant the first and second sidewalls of the gate trenches 480, the implant is not angled in a perpendicular direction that extends parallel to the gate trenches 480.

One advantage of the power MOSFET 800 is that the deep shielding patterns 840 may readily be formed to a desired depth since the implant is made into the bottom surfaces of the gate trenches 480, while also providing a good electrical connection between the deep shielding patterns 840 and the p-wells 472 by implanting the sidewalls of selected portions of the gate trenches 480 to form the deep shielding connection patterns 844. This approach allows the deep shielding patterns 840 to be spaced closer together as compared to the power MOSFET 200 of FIG. 2 above, which is advantageous for control of the blocking properties and the on-state resistance of the device. Additionally, since the angled implant provides the electrical connection between the deep shielding patterns 840 and the p-wells 472, the need for separate electrical connections may be eliminated, which is one of the disadvantages of the power MOSFET 300 of FIG. 3 above. Moreover, fabrication of the power MOSFET 800 does not require the second epitaxial growth step that is used in the fabrication of the power MOSFET of FIG. 1 which can lead to alignment difficulties and requires an extra fabrication step.

Figure 11:
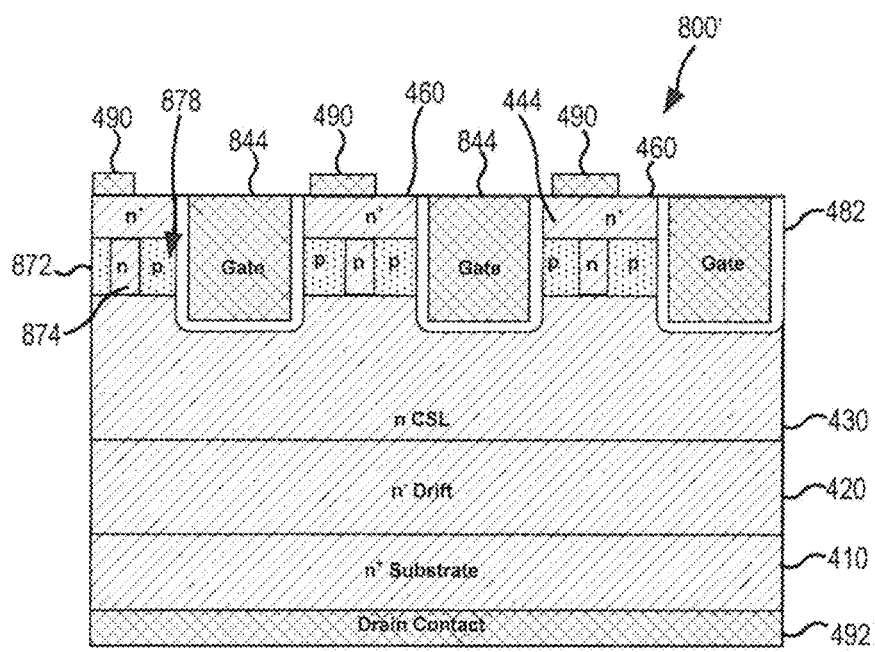
FIG. 11 is a cross-sectional view taken along line 10C-10C of FIG. 10A that illustrates the design of a modified version of the power MOSFET of FIGS. 10A-10D.

FIG. 11 is a cross-sectional view taken along line 10C-10C of FIG. 10A that illustrates the design of a modified version 800' of the power MOSFET 800 of FIGS. 10A-10D. As shown in FIG. 11, the one difference between the power MOSFET 800' and the power MOSFET 800 is that the p-wells 872 in the power MOSFET 800' further include thin stripes (e.g., less than 0.5 microns wide) of un-implanted n-type silicon carbide 874. The stripes 874 of n-type silicon carbide included in the p-wells 872 may have a doping concentration of, for example, less than $1 \times 10^{17}/cm^3$ in some embodiments. The rest of the p-wells 872 may be more highly-doped p-type, at least with a doping concentration greater than $1 \times 10^{17}/cm^3$. The provision of the n-type silicon carbide stripes 874 may enhance the current flow through the channel regions, and since they have low doping concentrations the n-type silicon carbide stripes 874 may be depleted during normal off-state operation.

Figure 12:
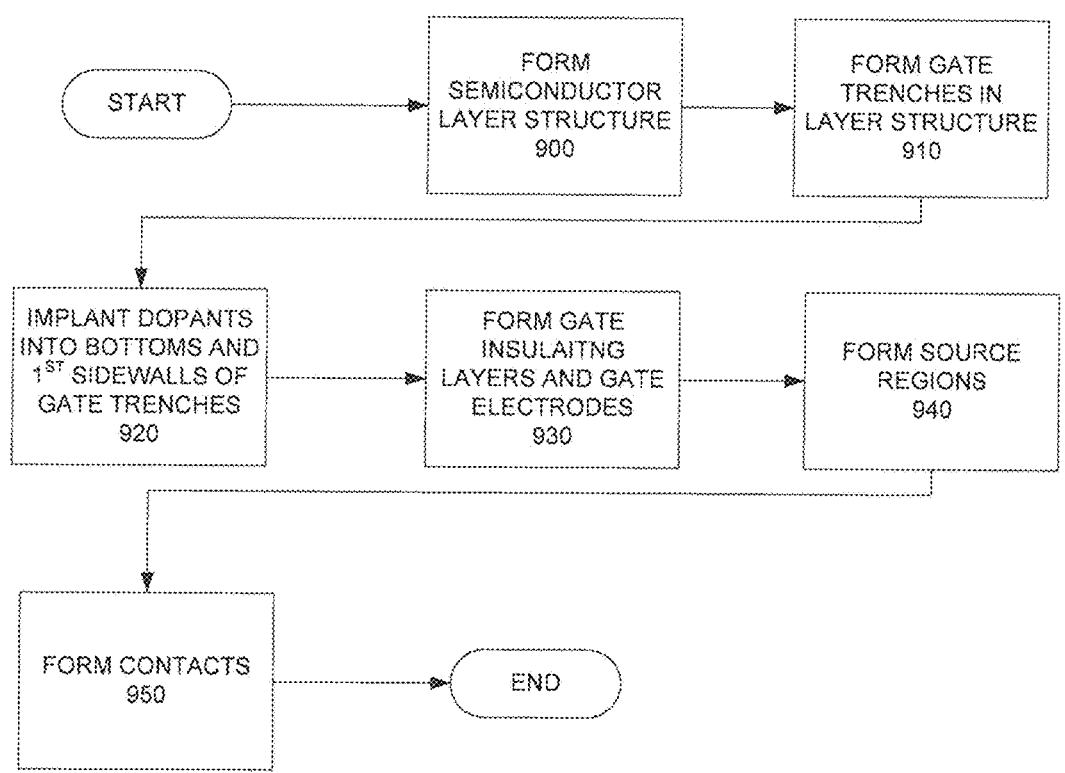
FIG. 12 is a flow chart that illustrates a method of fabricating gate trench power semiconductor devices according to embodiments of the present invention.

FIG. 12 is a flow chart that illustrates a method of fabricating a gate trench power semiconductor device having a buried edge termination according to embodiments of the present invention.

With reference to FIG. 12 and FIGS. 9A-9F, operations may begin with a wide band-gap semiconductor layer structure (Block 900). The semiconductor layer structure may include a substrate and a plurality of semiconductor layers that are grown on the substrate by epitaxial growth. The semiconductor layer structure may include a drift region that has a first conductivity type. The semiconductor layer structure may further include well regions having a second conductivity type on the drift region. A plurality of gate trenches are formed in an upper surface of the semiconductor layer structure (Block 910). The gate trenches may extend in a first direction and may be spaced apart from each other in a second direction that is perpendicular to the first direction. Each gate trench may have a bottom surface, a first sidewall that extends in the first direction and a second sidewall that extends in the first direction. Dopants having the second conductivity type that is opposite the first conductivity type may be implanted into the bottom surfaces and the first sidewalls of the respective gate trenches (Block 920). In some embodiments, the dopants having the second conductivity type may be implanted into the first sidewalls of the gate trenches using an angled ion implant. The angled ion implant may be at an implant angle of, for example, between 2 and 15 degrees in some embodiments. The second conductivity dopants implanted into the bottom surfaces of the gate trenches may form a plurality of deep shielding patterns underneath the respective gate trenches, and the second conductivity dopants implanted into the first sidewall of the gate trenches may form a plurality of deep shielding connection patterns that electrically connect the deep shielding regions to the respective well regions. Gate insulating layers and gate electrodes may be formed in the gate trenches (Block 930). Source regions having the first conductivity type may be formed on the well regions via ion implantation (Block 940). Contacts may be formed on the top and bottom surfaces of the semiconductor layer structure to complete the device (Block 950).

The completed device may include channel regions that are formed in the respective second sidewalls of the gate trenches. In some embodiments, each channel region may be directly opposite a portion of a respective one of the deep shielding connection patterns that are formed in the first sidewalls of the gate trenches.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.). Herein, where a contact can be either a source contact or a drain contact it may be referred to as a "source/drain contact."

While the present invention is described above with respect to power MOSFET and power IGBT implementations, it will be appreciated that the techniques described herein apply equally well to other similar vertical power devices having a gate trench. Thus, embodiments of the present invention are not limited MOSFETs and IGBTs, and the techniques disclosed herein may be used on any appropriate gate trench device.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Likewise, the shield regions under the gate trenches may be included or omitted in any of the embodiments. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
   a semiconductor layer structure comprising a drift region that includes a wide band-gap semiconductor material, the drift region having a first conductivity type;
   a gate trench in an upper portion of the semiconductor layer structure, the gate trench having first and second opposed sidewalls that extend in a first direction in the upper portion of the semiconductor layer structure;
   a shielding pattern having a second conductivity type that is opposite the first conductivity type in the semiconductor layer structure underneath a bottom surface of the gate trench;
   a shielding connection pattern that has the second conductivity type in the first sidewall of the gate trench; and
   a semiconductor channel region that has the first conductivity type in the second sidewall of the gate trench.

2. The semiconductor device of claim 1, wherein the semiconductor channel region is in a portion of the second sidewall that is directly opposite a portion of the first sidewall that includes a portion of the shielding connection pattern.

3. The semiconductor device of claim 2, wherein the semiconductor layer structure further comprises a well region having the second conductivity type, wherein the shielding connection pattern electrically connects the shielding pattern to the well region.

4. The semiconductor device of claim 2, wherein the first sidewall of the gate trench is angled at an angle of less than eighty degrees with respect to the upper portion of the semiconductor layer structure.

5. The semiconductor device of claim 1, wherein the gate trench is in an active region of the semiconductor device, the semiconductor device further comprising a termination region that surrounds the active region, the termination region including a plurality of termination trenches in the upper portion of the semiconductor layer structure.

6. The semiconductor device of claim 5, further comprising a plurality of termination structures having the second conductivity type that are provided beneath the respective termination trenches.

7. The semiconductor device of claim 6, wherein the termination structures also extend into an inner sidewall but not an outer sidewall of a first portion of the respective termination trenches and into the outer sidewall but not the inner sidewall of a second portion of the respective termination trenches.

8. The semiconductor device of claim 6, wherein a bottom of the shielding pattern is at approximately a same depth in the semiconductor layer structure as a bottom of each termination structure.

9. The semiconductor device of claim 6, wherein the termination structures comprise guard rings.

10. The semiconductor device of claim 1, further comprising:
    an additional plurality of gate trenches in the upper portion of the semiconductor layer structure, each of the additional plurality of gate trenches having respective first and second opposed sidewalls that extend in the first direction;
    an additional plurality of shielding patterns having the second conductivity type in the semiconductor layer structure underneath bottom surfaces of the respective additional plurality of gate trenches;
    an additional plurality of shielding connection patterns that have the second conductivity type in first sidewalls of the respective additional plurality of gate trenches; and
    an additional plurality of semiconductor channel regions that have the first conductivity type in the second sidewalls of the respective additional plurality of gate trenches.

11. The semiconductor device of claim 1, wherein the shielding pattern comprises a plurality of spaced apart shielding regions underneath the gate trench and the shielding connection pattern comprises a plurality of spaced apart shielding connection regions in the first sidewall of the gate trench, wherein the semiconductor channel region is in a portion of the second sidewall that is opposite a portion of the first sidewall that is between first and second of the shielding connection regions.

12. The semiconductor device of claim 1, wherein the shielding pattern comprises a continuous shielding region that extends underneath the gate trench and the shielding connection pattern comprises a continuous shielding connection region in the first sidewall of the gate trench.

13. A semiconductor device, comprising:
    a semiconductor layer structure that has an active region and a termination region, the semiconductor layer structure comprising a drift region that includes a wide band-gap semiconductor material having a first conductivity type;
    a plurality of gate trenches in the active region that are formed in an upper portion of the semiconductor layer structure, the gate trenches extending in a first direction and spaced apart from each other in a second direction that is perpendicular to the first direction;

a plurality of shielding patterns doped with dopants having a second conductivity type that is opposite the first conductivity type, the shielding patterns located in the semiconductor layer structure underneath the respective gate trenches;

a plurality of termination trenches in the termination region that are formed in the upper portion of the semiconductor layer structure;

a plurality of termination structures doped with dopants having the second conductivity type, the termination structures located in the semiconductor layer structure underneath the respective termination trenches.

14. The semiconductor device of claim 13, wherein each termination structure also extends into at least one sidewall of the respective termination trenches.

15. The semiconductor device of claim 13, further comprising a plurality of shielding connection patterns that have the second conductivity type in first sidewalls of the respective gate trenches, each shielding connection pattern electrically connecting a respective one of the shielding patterns to a common source contact.

16. The semiconductor device of claim 15, further comprising a plurality of semiconductor channel regions that have the first conductivity type in the second sidewalls of the respective gate trenches.

17. The semiconductor device of claim 16, wherein each semiconductor channel region is directly opposite a portion of the first sidewall that includes a portion of a respective one of the shielding connection patterns.

18. The semiconductor device of claim 13, wherein the termination structures also extend into an inner sidewall but not an outer sidewall of a first portion of the respective termination trenches and into the outer sidewall but not the inner sidewall of a second portion of the respective termination trenches.

19. A method of forming a semiconductor device, the method comprising:

forming a wide band-gap semiconductor layer structure on a substrate, the semiconductor layer structure including a drift region that has a first conductivity type;

forming a plurality of gate trenches in an upper portion of the semiconductor layer structure, the gate trenches extending in a first direction and spaced apart from each other in a second direction that is perpendicular to the first direction, each gate trench having a bottom surface, a first sidewall that extends in the first direction and a second sidewall that extends in the first direction;

implanting dopants having the second conductivity type that is opposite the first conductivity type into the bottom surfaces and the first sidewalls of the gate trenches via a first angled ion implant; and implanting dopants having the second conductivity type into the bottom surfaces and the second sidewalls of the gate trenches via a second angled ion implant.

20. The method of claim 19, wherein channel regions are formed in the respective second sidewalls of the gate trenches.

21. The method of claim 19, further comprising forming a termination structure in a termination region of the semiconductor device, wherein the semiconductor layer structure includes a plurality of well regions having the second conductivity type between the gate trenches, wherein the second conductivity dopants implanted into the bottom surfaces of the gate trenches form a plurality of shielding patterns underneath the respective gate trenches, and the second conductivity dopants implanted into the first sidewall of the gate trenches form a plurality of shielding connection patterns that electrically connect the shielding regions to the respective well regions, and wherein the termination structure is formed by ion implantation simultaneously with the shielding patterns and the shielding connection patterns.

22. The method of claim 21, wherein the well regions are in the semiconductor layer structure, and wherein the semiconductor layer structure is formed in a single epitaxial growth process.

* * * * *

UNITED STATES PATENT AND TRADEMARK OFFICE
CERTIFICATE OF CORRECTION

PATENT NO. : 9,887,287 B1  
APPLICATION NO. : 15/372516  
DATED : February 6, 2018  
INVENTOR(S) : Lichtenwalner et al.

It is certified that error appears in the above-identified patent and that said Letters Patent is hereby corrected as shown below:

In the Specification

Column 12, Line 12: Please correct "411" to read -- 4H --

Column 12, Line 21: Please correct "(n)" to read -- ($n^-$) --

Column 16, Line 22: Please correct "or" to read -- α --

Column 16, Line 65: Please correct "IOBT" to read -- IGBT --

Signed and Sealed this  
Twenty-ninth Day of May, 2018

Andrei Iancu  
*Director of the United States Patent and Trademark Office*